(12) United States Patent
Hekmatshoartabari et al.

(10) Patent No.: US 10,903,360 B1
(45) Date of Patent: Jan. 26, 2021

(54) VERTICALLY INTEGRATED MEMORY CELLS WITH COMPLEMENTARY PASS TRANSISTOR SELECTORS

(71) Applicant: International Business Machines Corporation, Armonk, NY (US)

(72) Inventors: Bahman Hekmatshoartabari, White Plains, NY (US); Ruilong Xie, Niskayuna, NY (US); Alexander Reznicek, Troy, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/741,238

(22) Filed: Jan. 13, 2020

(51) Int. Cl.
| | |
|---|---|
| *H01L 29/78* | (2006.01) |
| *G11C 11/24* | (2006.01) |
| *H01L 29/08* | (2006.01) |
| *H01L 29/66* | (2006.01) |
| *H01L 21/02* | (2006.01) |
| *H01L 21/762* | (2006.01) |
| *H01L 27/11507* | (2017.01) |

(Continued)

(52) U.S. Cl.
CPC ...... *H01L 29/7827* (2013.01); *G11C 11/1657* (2013.01); *G11C 11/221* (2013.01); *G11C 11/2257* (2013.01); *G11C 13/0004* (2013.01); *G11C 13/0007* (2013.01); *G11C 13/0028* (2013.01); *H01L 21/02532* (2013.01); *H01L 21/76224* (2013.01); *H01L 27/11507* (2013.01); *H01L 27/228* (2013.01); *H01L 27/2454* (2013.01); *H01L 29/0847* (2013.01); *H01L 29/1037* (2013.01); *H01L 29/6656* (2013.01); *H01L 29/66666* (2013.01); *G11C 11/161* (2013.01); *G11C 2213/31* (2013.01); *G11C 2213/32* (2013.01); *G11C 2213/52* (2013.01); *G11C 2213/79* (2013.01); *H01F 10/3254* (2013.01); *H01F 10/3286* (2013.01); *H01L 21/308* (2013.01); *H01L 21/3065* (2013.01); *H01L 43/02* (2013.01); *H01L 45/06* (2013.01); *H01L 45/1233* (2013.01); *H01L 45/1253* (2013.01); *H01L 45/144* (2013.01); *H01L 45/145* (2013.01)

(58) Field of Classification Search
USPC ........................................... 365/145
See application file for complete search history.

(56) References Cited

U.S. PATENT DOCUMENTS 5,831,897 A   11/1998  Hodges
5,963,800 A   10/1999  Augusto
(Continued)

OTHER PUBLICATIONS

U.S. Appl. No. 16/109,369 titled Multilayer Back End of Line (BEOL)-Stackable Cross-Point Memory Array With Complementary Pass Transistor Selectors filed Aug. 22, 2018, 80 pages, first named inventor Bahman Hekmatshoartabari.

*Primary Examiner* — Tan T. Nguyen
(74) *Attorney, Agent, or Firm* — Scully, Scott, Murphy & Presser, P.C.; L. Jeffrey Kelly, Esq.

(57) ABSTRACT

A cross-point memory is provided that enables the use of complementary pass transistors as selection devices in a dense memory array. The density impact of doubling the transistor count and the additional lines required for addressing the array is minimized by stacking the memory elements on vertical transistors with shared transistor bodies (i.e., semiconductor material pillars) and shared wordlines.

20 Claims, 29 Drawing Sheets

(51) Int. Cl.
  *H01L 27/24*      (2006.01)
  *H01L 27/22*      (2006.01)
  *G11C 11/16*      (2006.01)
  *G11C 11/22*      (2006.01)
  *G11C 13/00*      (2006.01)
  *H01L 29/10*      (2006.01)
  *H01L 21/3065*   (2006.01)
  *H01L 21/308*    (2006.01)
  *H01L 45/00*      (2006.01)
  *H01L 43/02*      (2006.01)
  *H01F 10/32*      (2006.01)

(56) References Cited

U.S. PATENT DOCUMENTS

| | | |
|---|---|---|
| 6,643,172 B2 | 11/2003 | Ogura |
| 7,826,301 B2 | 11/2010 | Dudeck et al. |
| 9,171,849 B2 | 10/2015 | Chan et al. |
| 9,646,681 B1 | 5/2017 | Jung et al. |
| 9,711,511 B1 | 7/2017 | Lim et al. |
| 9,966,128 B1 | 5/2018 | Bossu |
| 2008/0209118 A1* | 8/2008 | Kajiyama ............... G11C 11/16 711/105 |
| 2011/0254085 A1* | 10/2011 | Lee ................... H01L 27/10823 257/330 |
| 2012/0161096 A1* | 6/2012 | Pellizzer ............. H01L 27/2463 257/5 |
| 2013/0248965 A1* | 9/2013 | Nakai ................ H01L 27/11575 257/315 |
| 2018/0040376 A1* | 2/2018 | Delalleau .......... H01L 29/42328 |
| 2019/0067298 A1* | 2/2019 | Karda ................ H01L 21/82388 |

* cited by examiner

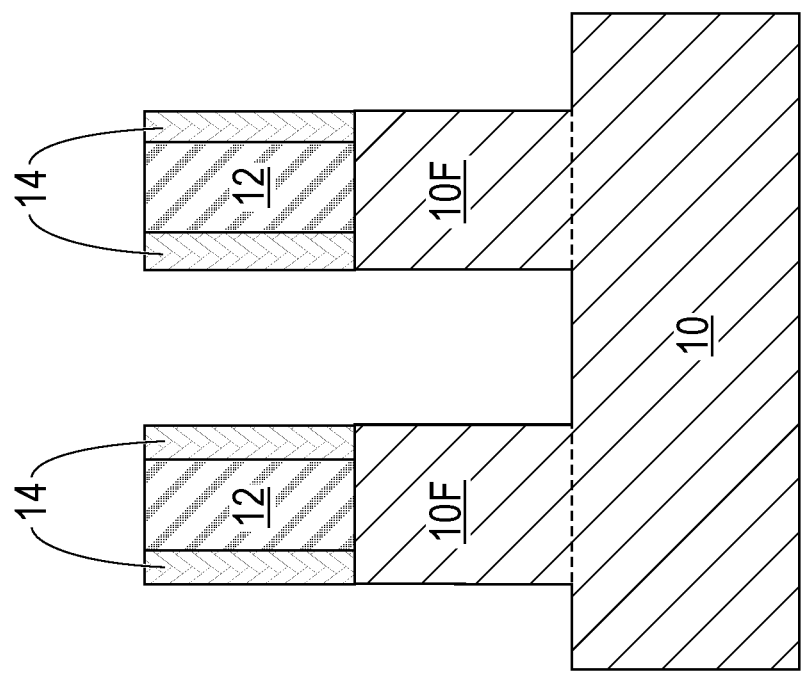
FIG. 2B
FIG. 2A

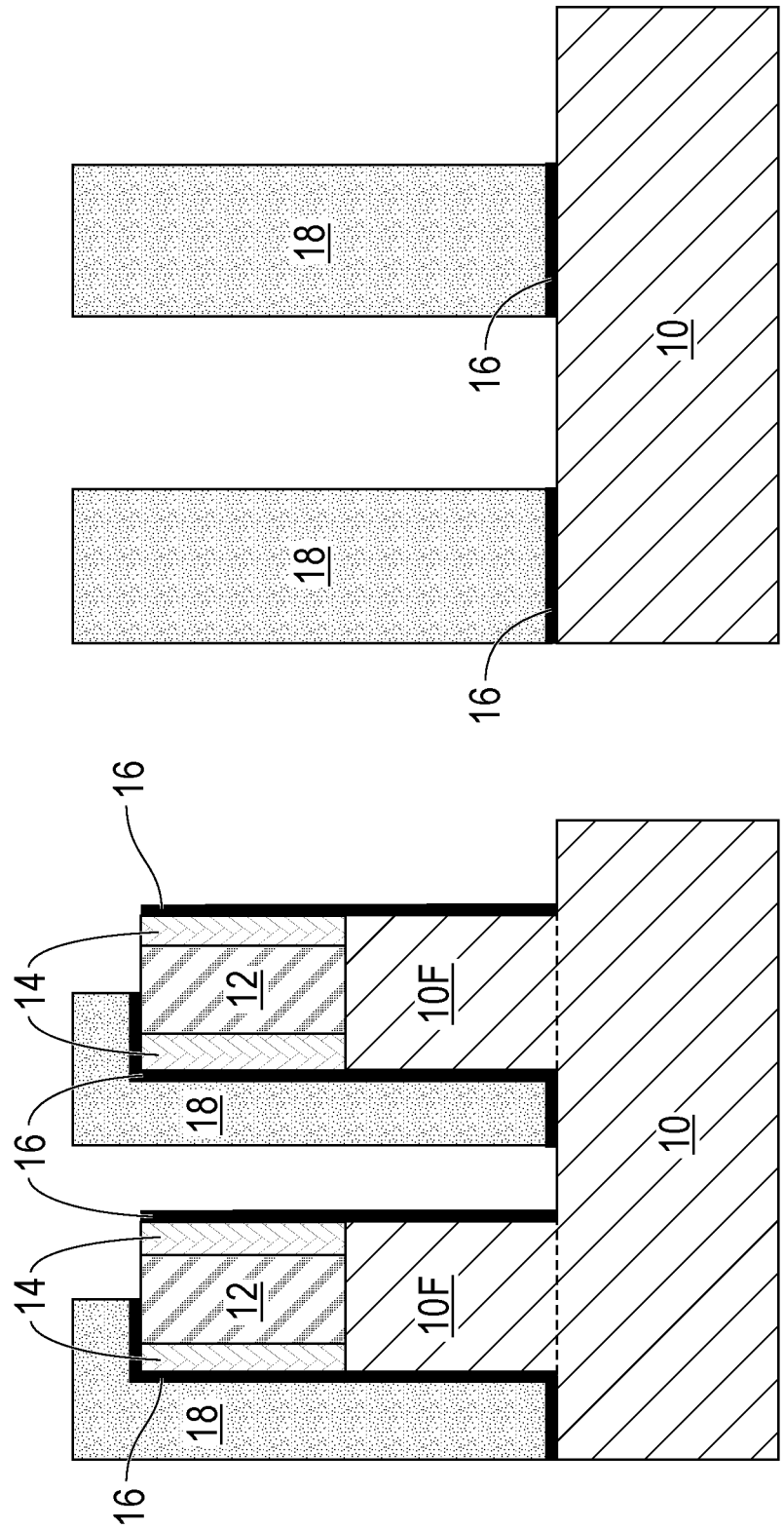

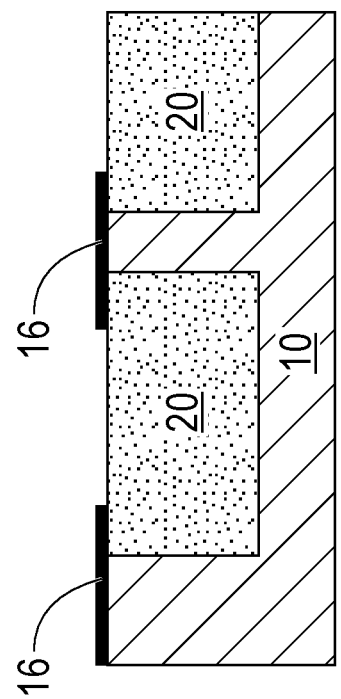
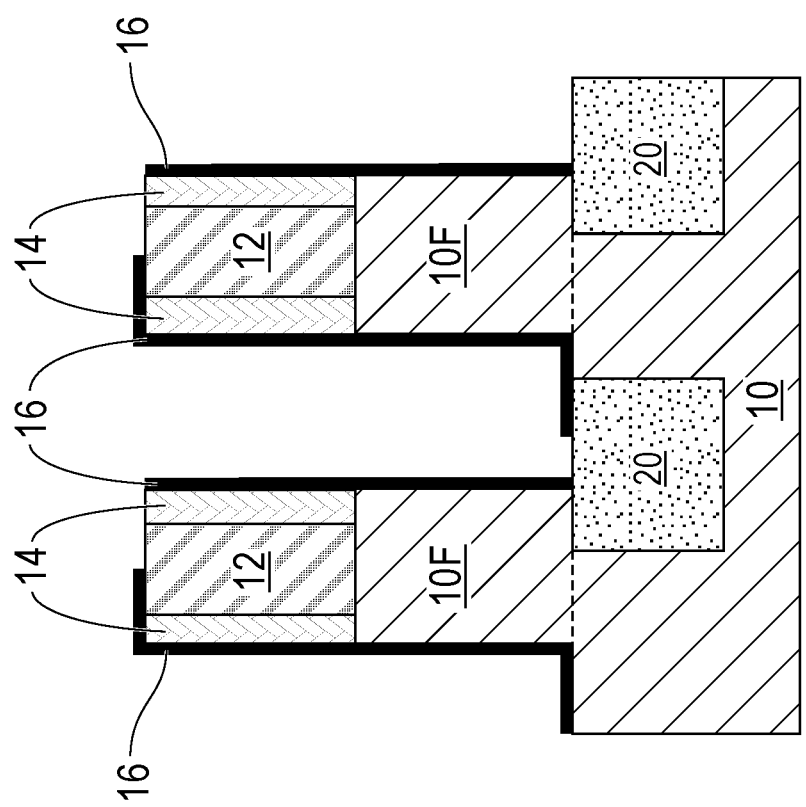
FIG. 4A
FIG. 4B

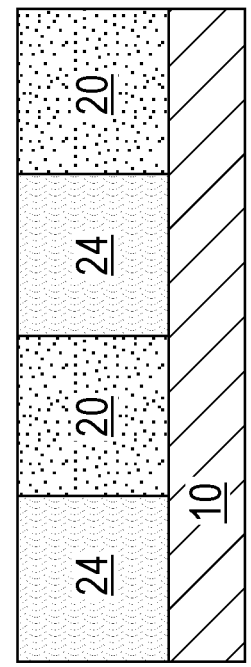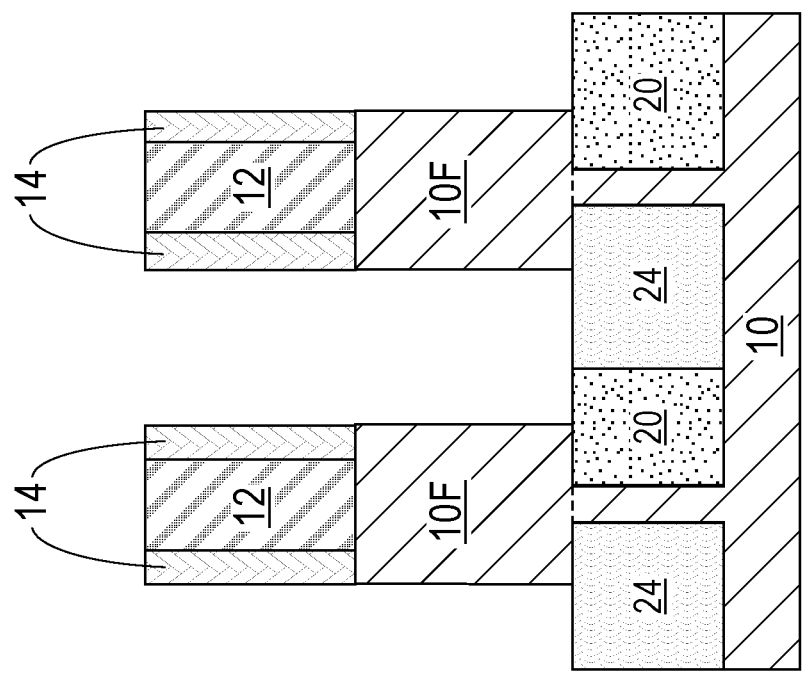
FIG. 6B
FIG. 6A

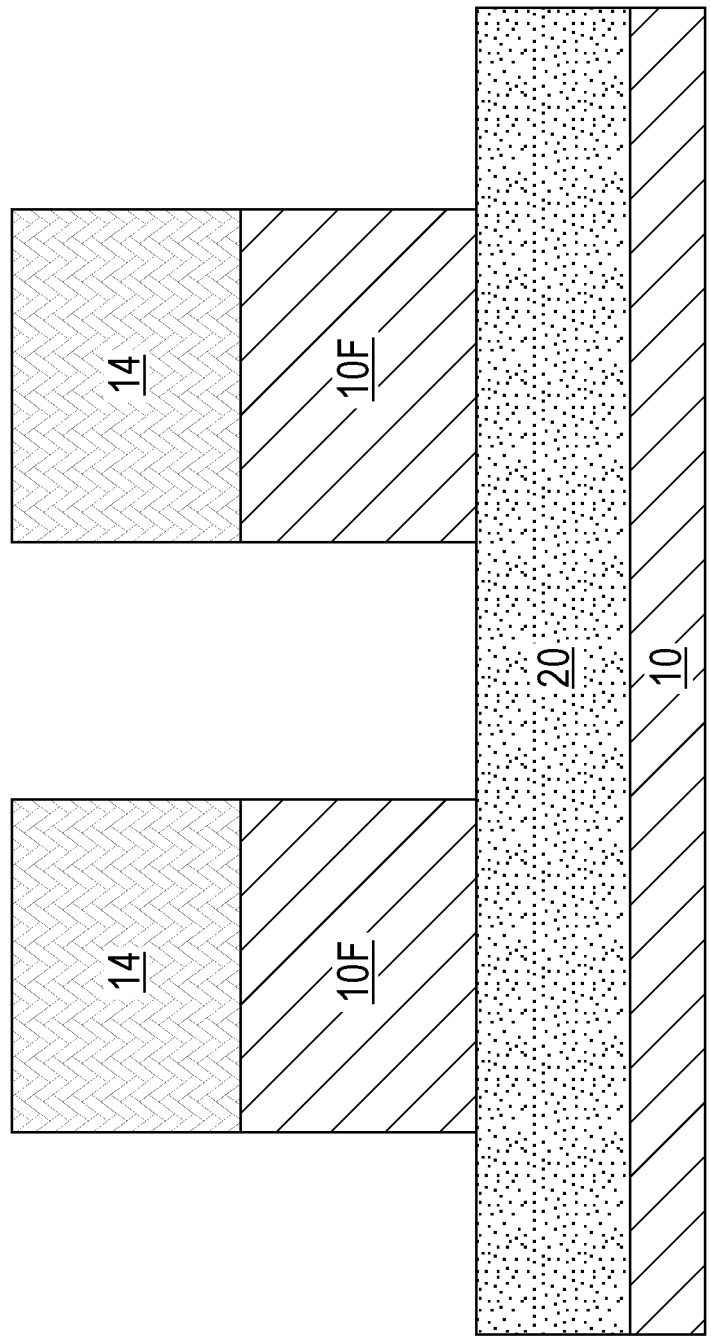

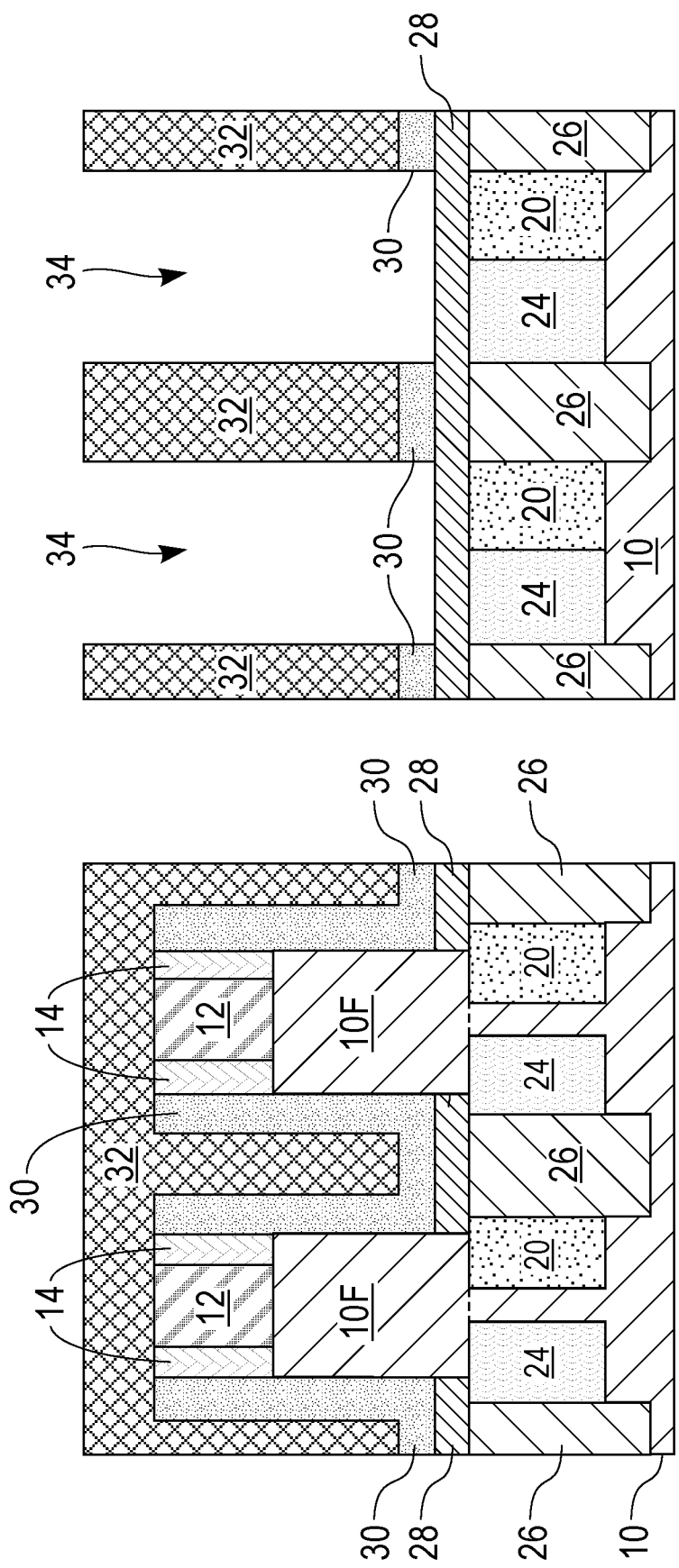

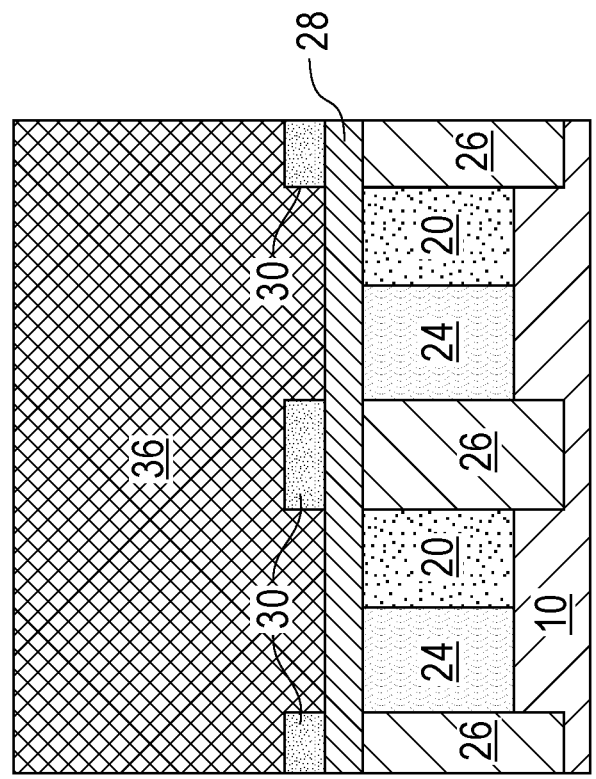
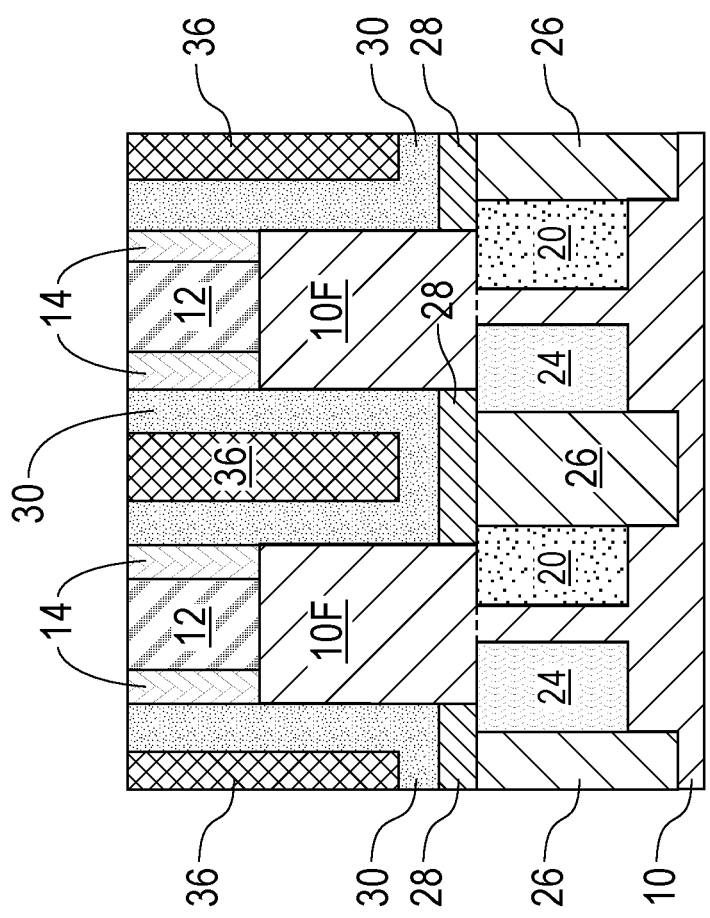
FIG. 9B
FIG. 9A

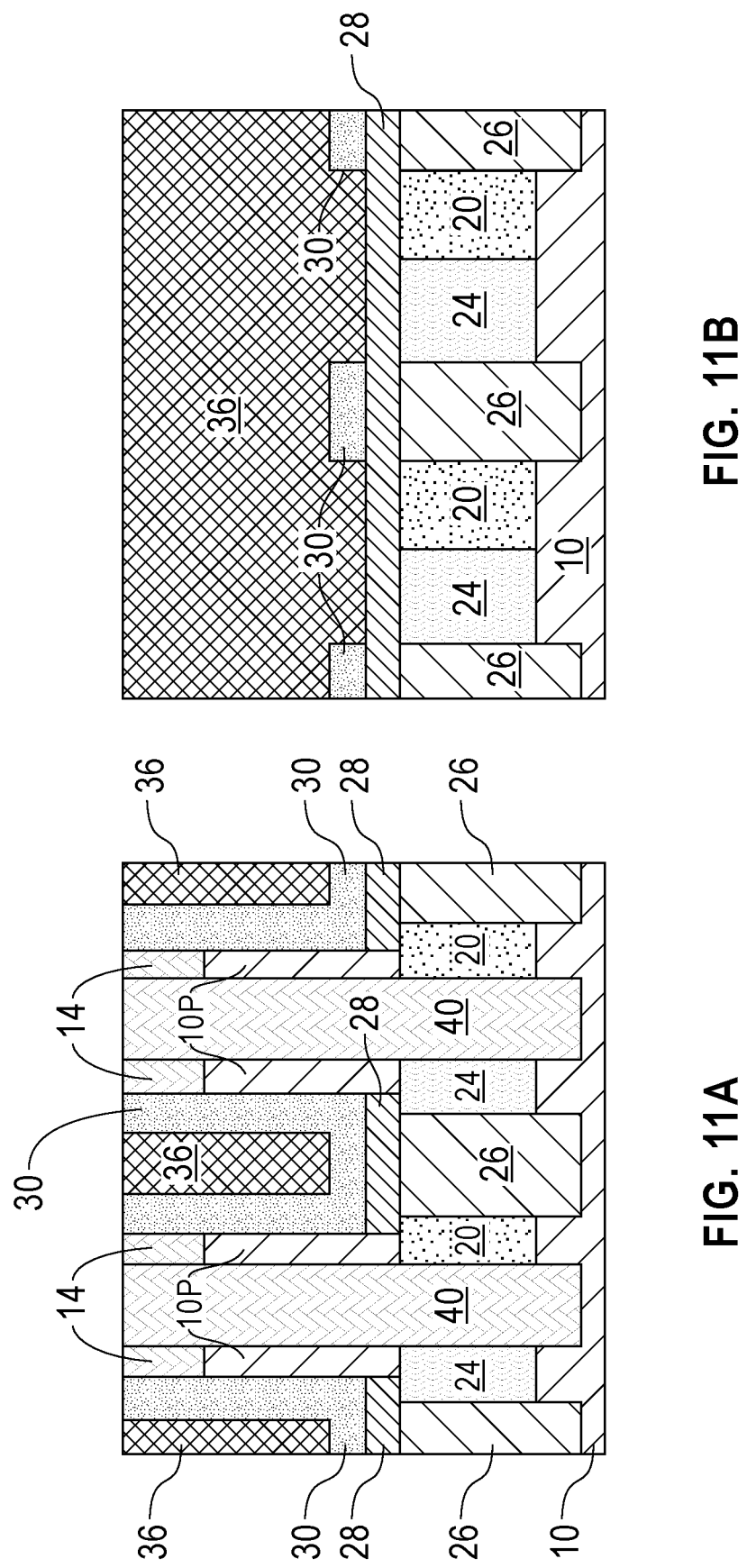

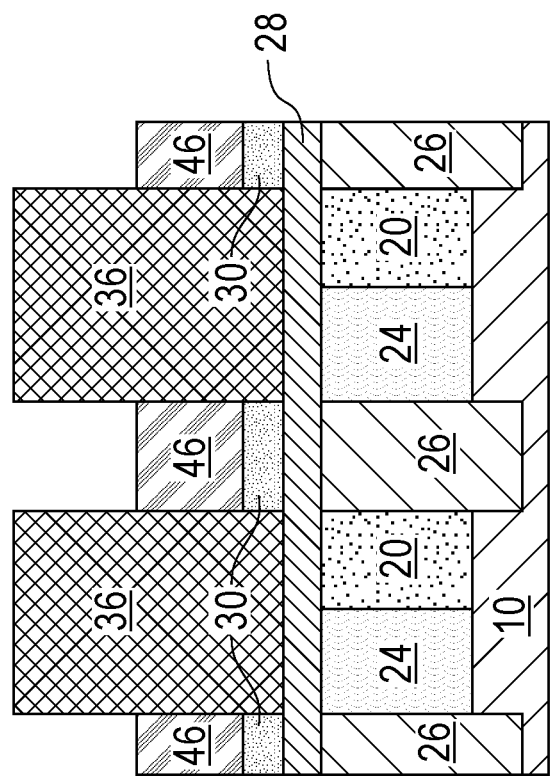
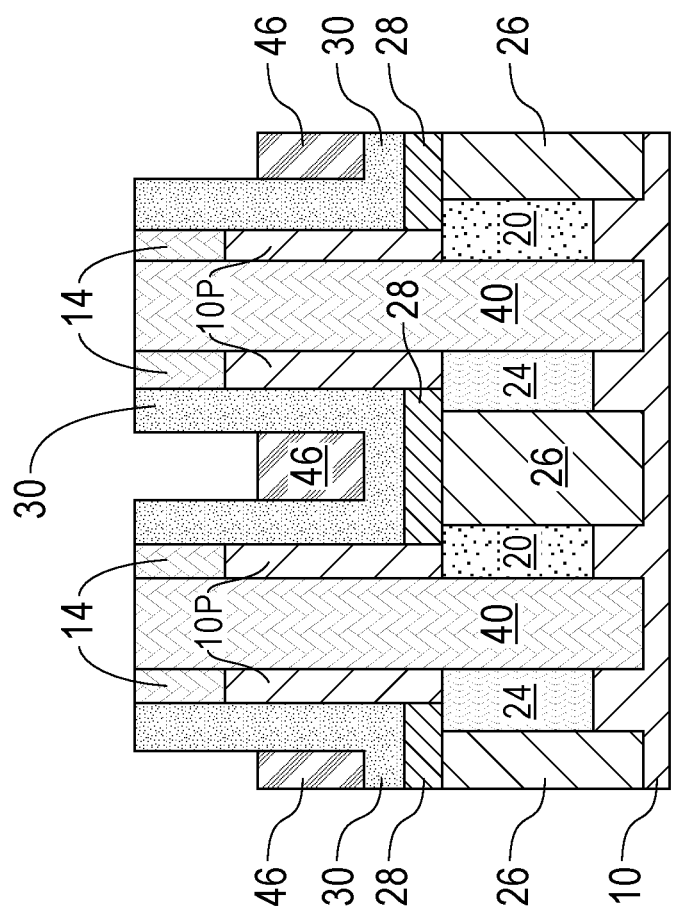
FIG. 13B
FIG. 13A

VERTICALLY INTEGRATED MEMORY CELLS WITH COMPLEMENTARY PASS TRANSISTOR SELECTORS

BACKGROUND

The present application relates to semiconductor technology, and more particularly to a cross-point memory that enables the use of complementary pass transistors as selection devices in a dense memory array.

Emerging memory applications such as, for example, spin-transfer torque magnetic random access memory (STT-MRAM) and resistive random access memory (RRAM) require bidirectional selection for efficient operation. Transistor selectors enable bidirectional operation; however, such selectors introduce some asymmetry. This is because, depending on the voltage polarity of the operation, the transistor terminal connected to the memory cell may be the functional drain or the functional source. The issue of asymmetry becomes more problematic for multi-state or synaptic memories.

Complementary pass transistors (also known as transmission gates) can be used to substantially alleviate the asymmetry issue, but the doubling of transistor count and the additional addressing lines compromise the density of the memory array.

SUMMARY

A cross-point memory is provided that enables the use of complementary pass transistors as selection devices in a dense memory array. The density impact of doubling the transistor count and the additional lines required for addressing the array is minimized by stacking the memory elements on vertical transistors with shared transistor bodies (i.e., semiconductor material pillars) and shared wordlines.

In one aspect of the present application, a cross-point memory array is provided. In one embodiment, the cross-point memory array includes an array of bitlines, wordlines, select lines, memory cells and selection elements arranged in a cross-point memory configuration, wherein each selection element is comprised of an n-channel vertical field effect transistor (VFET) and a p-channel VFET with shared source/drain terminals, wherein the n-channel VFET is separated from the p-channel VFET by a dielectric spacer, and wherein the n-channel VFET and the p-channel VFET in two adjacent memory cells have gate structures that share a common wordline.

In another aspect of the present application, a method of forming a cross-point memory array is provided. In one embodiment, the method includes forming a plurality of semiconductor fins on a surface of a semiconductor substrate, wherein each semiconductor fin is capped with a first hard mask cap and a pair of second hard mask caps; forming a first conductivity type bottom source/drain structure in the semiconductor substrate and on a first side of each of the semiconductor fins; forming a second conductivity type bottom source/drain structure in the semiconductor substrate and on a second side of each of the semiconductor fins, wherein the second side is opposite the first side; forming a gate structure laterally adjacent to each semiconductor fin; removing each first hard mask cap, an underlying portion of each semiconductor fin and an underlying portion of the semiconductor substrate to provide a gap that separates a first semiconductor pillar of a first conductivity type VFET from a second semiconductor pillar of a second conductivity type VFET; filling the gap with a dielectric material to provide a dielectric spacer; forming gate contact trenches that physically expose each gate structure of the first and second conductivity type VFETs; forming a buried wordline contact structure in a lower portion of each of the gate contact trenches; removing the second hard mask caps from atop the first and second semiconductor pillars; recessing an upper portion of the gate structures; forming a first conductivity type top source/drain structure on an exposed surface of the first semiconductor pillar of the first conductivity type VFETs, and a second conductivity type top source/drain structure from an exposed surface of the second semiconductor pillar of the second conductivity type VFETs; forming a memory cell above each pair of first conductivity type VFETs, and second conductivity type VFETs that are separated by the dielectric spacer; and forming bitlines contacting the memory cell, and select lines that contact the bottom source/drain structures of the first conductivity type VFETs and second conductivity type VFETs.

In yet another aspect of the present application, a method of operating a cross-point memory array is provided. In one embodiment, the method of operating the cross-point memory array includes forming an array of bitlines, wordlines, select lines, memory cells and selection elements arranged in a cross-point memory configuration, wherein each selection element is comprised of a n-channel vertical field effect transistor (VFET) and a p-channel VFET with shared source/drain terminals, wherein the n-channel VFET is separated from the p-channel VFET by a dielectric spacer, and wherein the n-channel VFET and the p-channel VFET in two adjacent memory cells have gate structures that share a common wordline. A first voltage is applied via one of the wordlines to the gate structure of the p-channel VFET connected to the memory cell. A second voltage is applied via an adjacent wordline to the gate structure of the n-channel VFET connected to the memory cell, wherein the second voltage is greater than the first voltage. A third voltage is applied to all remaining wordlines, wherein the third voltage is a voltage that is between the first and second voltages, and wherein the second voltage is higher than a threshold voltage of the n-channel VFET and the first voltage is lower than a threshold voltage of the p-channel VFET.

BRIEF DESCRIPTION OF THE DRAWINGS

FIGS. 2A, 2B and 2C are various cross sectional views of an exemplary semiconductor structure that can be employed in the present application, the exemplary structure includes semiconductor fins located on a surface of a semiconductor substrate, wherein each semiconductor fin is capped with a first hard mask cap and a pair of second hard mask caps.

FIGS. 3A, 3B and 3C are various cross sectional views of the exemplary semiconductor structure shown in FIGS. 2A, 2B and 2C after forming a first patterned dielectric material liner that includes openings that physically expose a portion of the semiconductor substrate that is located on a first side of each of the semiconductor fins.

FIGS. 4A, 4B and 4C are various cross sectional views of the exemplary semiconductor structure shown in FIGS. 3A, 3B and 3C after forming a first conductivity type bottom source/drain structure in the physically exposed portion of the semiconductor substrate that is located on the first side of each of the semiconductor fins.

FIGS. 6A, 6B and 6C are various cross sectional views of the exemplary semiconductor structure shown in FIGS. 5A, 5B and 5C after patterning the second dielectric material layer to provide a second patterned dielectric material liner that has openings that physically expose a portion of the semiconductor substrate that is located on a second side of each of the semiconductor fins, forming a second conductivity type bottom source/drain structure in the physically exposed portion of the semiconductor substrate that is located on the second side of each of the semiconductor fins, and removing the second patterned dielectric material liner.

FIGS. 7A, 7B and 7C are various cross sectional views of the exemplary semiconductor structure shown in FIGS. 6A, 6B and 6C after forming a shallow trench isolation (STI) structure in the semiconductor substrate.

FIGS. 8A, 8B and 8C are various cross sectional views of the exemplary semiconductor structure shown in FIGS. 7A, 7B and 7C after forming a bottom spacer and a gate structure.

FIGS. 9A, 9B and 9C are various cross sectional views of the exemplary semiconductor structure shown in FIGS. 8A, 8B and 8C after forming an interlayer dielectric (ILD) material layer.

FIGS. 11A, 11B and 11C are various cross sectional views of the exemplary semiconductor structure shown in FIGS. 10A, 10B and 10C after filling the gap with a dielectric material to provide a dielectric spacer between each first and second semiconductor pillar.

FIGS. 13A, 13B and 13C are various cross sectional views of the exemplary semiconductor structure shown in FIGS. 12A, 12B and 12C after forming a buried wordline contact structure in a lower portion of each of the gate contact trenches.

DETAILED DESCRIPTION

Figure 1:
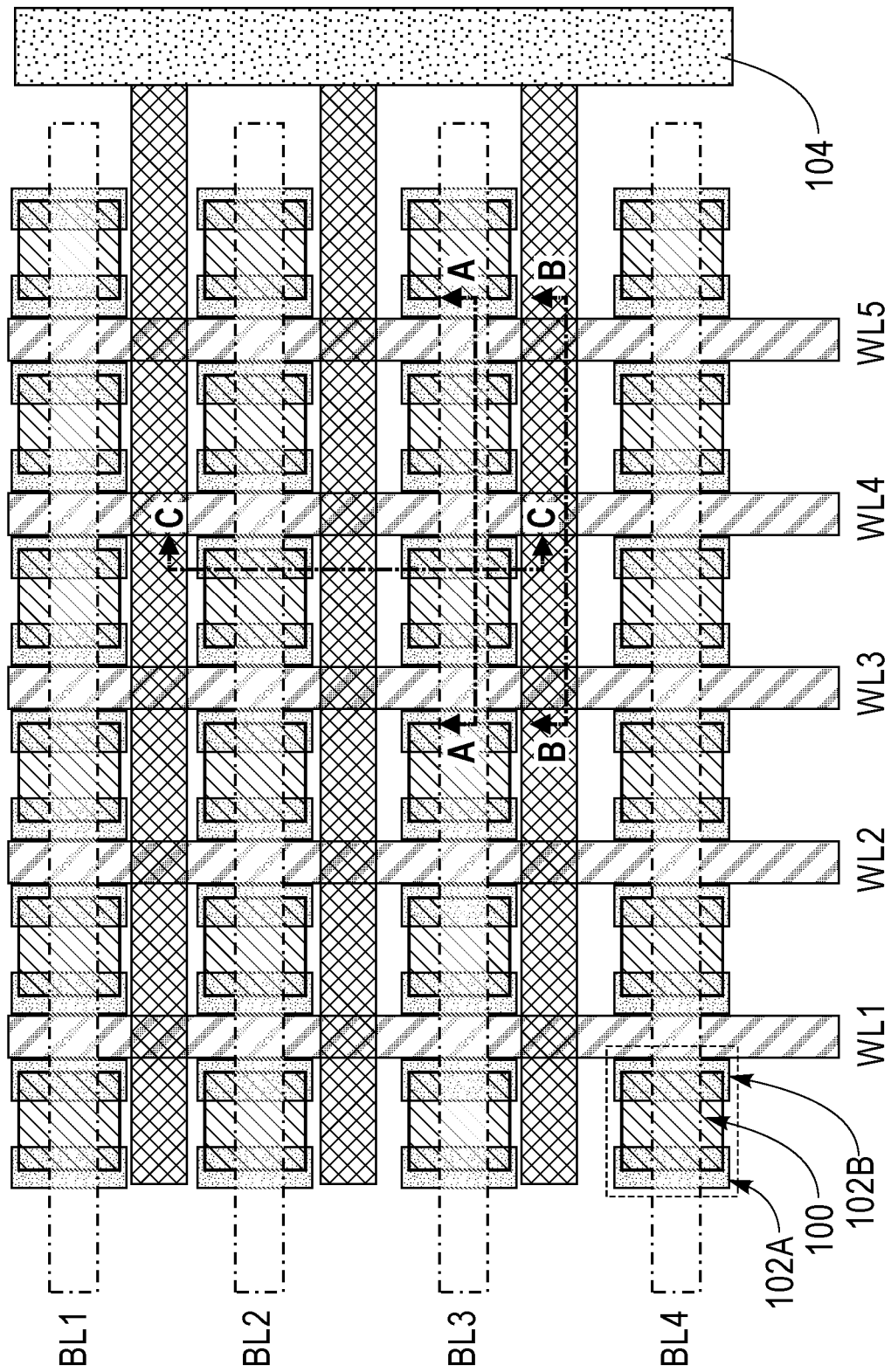
FIG. 1 is a diagram showing a cross-point memory layout of the present application including various cross sections; A-A is a cross sectional view along one of the rows of vertical field effect transistor (VFET) devices, B-B, which is parallel to cross section A-A, is a cross sectional view located in an area between two neighboring rows of VFET devices, and C-C, which is perpendicular to cross sections A-A and B-B, is a cross sectional view along one row of VFET devices of a same conductivity type.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated a diagram showing a cross point memory layout of the present application including various cross sections; A-A is a cross sectional view along one of the rows of vertical field effect transistor (VFET) devices, B-B, which is parallel to cross section A-A, is a cross sectional view located in an area between two neighboring rows of VFET devices, and C-C, which is perpendicular to cross sections A-A and B-B, is a cross sectional view along one row of VFET devices of a same conductivity type. These cross sectional views will be used throughout the remaining drawings of the present application. Notably, each of FIGS. 2A, 3A, 4A, 5A, . . . 15A, is a drawings through cross section A-A, each of FIGS. 2B, 3B, 4B, 5B, . . . 15B is a drawing through cross section B-B, and each of FIGS. 2C, 3C, 4C, 5C, . . . 15C is a drawing through cross sectional C-C.

In FIG. 1, BL1, BL2, BL3, BL4 denotes various bitlines, WL1, WL2, WL3, WL4, and WL5 denotes various wordlines (as is shown, each wordline runs perpendicular to each bitline), element 100 denotes a memory cell, elements 102A, 102B denotes a pair of VFETs, and element 104 denotes a common select line contact region. The pair of VFETS, which are located beneath the memory cell 100, includes an n-channel VFET (e.g., 102A) and a p-channel VFET (e.g., 102B). Elements 102A/102B define a selection element of the present application.

Notably, FIG. 1 and FIGS. 15A, 15B and 15 C to follow, illustrate a cross-point memory array of the present application. In one embodiment, the cross-point memory array includes an array of bitlines (BL1, BL2, BL3, BL4 or element 58), wordlines (WL1, WL2, WL3, WL4, and WL5 or element 46), select lines (element 60), memory cells (element 100 or combination of elements 56/56) and selection elements (102A, 102B) arranged in a cross-point memory configuration, wherein each selection element (102A, 102B) is comprised of a n-channel vertical field effect transistor (VFET) and a p-channel VFET with shared source/drain terminals, wherein the n-channel VFET 102A is separated from the p-channel VFET 102B by a dielectric spacer (element 40), and wherein the n-channel VFET and the p-channel VFET in two adjacent memory cells have gate structures 30 that share a common wordline 46.

In accordance with the present application, each memory cell is vertically integrated on one of the selection elements. In some embodiments, each memory cell shares a common bitline. In other embodiments, each memory cell shares a common select line.

The cross-point memory array can be operated by forming an array of bitlines, wordlines, select lines, memory cells and selection elements arranged in a cross-point memory configuration, wherein each selection element is comprised of a n-channel vertical field effect transistor (VFET) and a p-channel VFET with shared source/drain terminals, wherein the n-channel VFET is separated from the p-channel VFET by a dielectric spacer, and wherein the n-channel VFET and the p-channel VFET in two adjacent memory cells have gate structures that share a common wordline. A first voltage is applied via one of the wordlines to the gate structure of the p-channel VFET connected to the memory cell. A second voltage is applied via an adjacent wordline to the gate structure of the n-channel VFET connected to the memory cell, wherein the second voltage is greater than the first voltage. A third voltage is applied to all remaining wordlines, wherein the third voltage is a voltage that is between the first and second voltages, and wherein the second voltage is higher than a threshold voltage of the n-channel VFET and the first voltage is lower than a threshold voltage of the p-channel VFET. In one embodiment, the first voltage can be from −3.0 volts to −0.5 volts, the second voltage can be from 0.5 volts to 3.0 volts, and the third voltage can be from −0.5 volts to 0.5 volts. In some embodiments, the third voltage is chosen to be 0 (i.e., ground voltage).

Reference is now made to FIGS. 2A-15C, which illustrates the basic processing steps that can be used in the present application for providing a cross-point memory array in accordance with the present application.

Figure 2C:
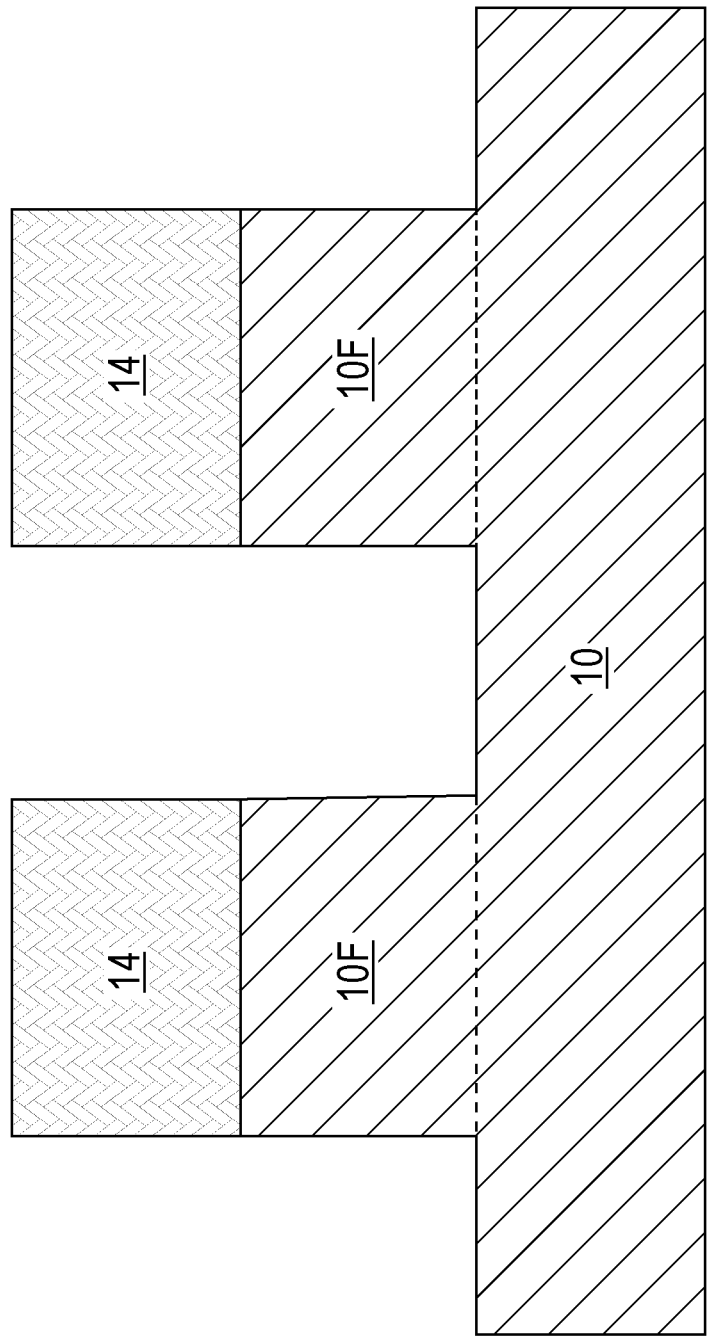

Referring now to FIGS. 2A, 2B and 2C, there are illustrated an exemplary semiconductor structure that can be employed in the present application. The exemplary structure of FIGS. 2A, 2B and 2C includes semiconductor fins 10F located on a surface of a semiconductor substrate 10, wherein each semiconductor fin 10F is capped with a first hard mask cap 12 and a pair of second hard mask caps 14. In the present application, the first hard mask caps 12 have a width that is greater than a width of each of second hard mask caps 14. In the present application, one of the second hard mask caps of the pair of second hard mask caps is located on a first side of the first hard mask cap 12 and a second of the second hard mask caps of the pair of second hard mask caps is located on a second side of the first hard mask cap.

The exemplary structure shown in FIGS. 2A, 2B and 2C can be formed by first providing a base semiconductor substrate (not shown); the base semiconductor substrate is subsequently processed into semiconductor substrate 10 that includes a plurality of semiconductor fins 10F extending upwards therefrom. The base semiconductor substrate is composed of any semiconductor material having semiconducting properties. Illustrative examples of semiconductor materials that can be used as the base semiconductor substrate include, but are not limited to, silicon (Si), germanium (Ge), a silicon germanium alloy (SiGe), silicon carbide (SiC), silicon germanium carbide (SiGeC), a III-V compound semiconductor or a II-VI compound semiconductor.

Next, a first hard mask layer (not shown) is formed on the base semiconductor substrate. The first hard mask layer is composed of a first hard mask material such as, for example, silicon dioxide. In one embodiment, the first hard mask layer can be formed utilizing a deposition process such as, for example, chemical vapor deposition (CVD), plasma enhanced chemical vapor deposition (PECVD), physical vapor deposition (PVD) or atomic layer deposition (ALD). In another embodiment, the first hard mask layer can be formed utilizing a thermal growth process such as, for example, thermal oxidation. The first hard mask layer can have a thickness from 5 nm to 50 nm; although other thicknesses are possible and can be used as the thickness of the first hard mask layer.

The first hard mask layer is then patterned to provide a plurality of first hard mask caps 12 on the base semiconductor substrate. The patterning of the first hard mask layer can include lithography and etching. Lithography includes forming a photoresist material on a material or material stack that needs to be patterned, exposing the photoresist material to a pattern of irradiation, and developing the exposed photoresist material to provide a patterned photoresist. In some embodiments, the etch used to provide the plurality of first hard mask caps 12 can include a dry etching process such as, for example, reactive ion etching (RIE), ion beam etching (IBE) or plasma etching. In other embodiments, the etch used to provide the plurality of first hard mask caps 12 can include a chemical wet etch process. Following the formation of the plurality of first hard mask caps 12, the patterned photoresist can be removed utilizing a conventional photoresist removal process such as, for example, ashing. Each first hard mask cap 12 has a first width which can be from 20 nm to 200 nm; the thickness of each first hard mask cap 12 is determined by the thickness of the first hard mask layer.

A second hard mask cap 14 is then formed on each sidewall of each first hard mask cap 12 and on the base semiconductor substrate. The second hard mask caps 14 are composed of a second hard mask material which is compositionally different from, and more etch resistant than, the first hard mask material that provides the first hard mask caps 12. In one example, each second hard mask cap 14 is composed of silicon nitride, and each first hard mask cap 12 is composed of silicon dioxide (i.e., $SiO_2$). The second hard mask caps 14 can be formed by first depositing a layer of the second hard mask material and then subjecting the layer of the second hard mask material to a spacer etch, such as, for example, RIE. In some embodiments, and prior to performing the spacer etch, a material removal process such as, for example, a planarization or etch back process, can be used to remove any second hard mask material from the topmost surface of the first hard mask caps 12. As is shown, the second hard mask caps 14 are laterally adjacent to the first hard mask caps 12. The second hard mask caps 14 have a second width that is less than the first width of the first hard mask caps 12. The second hard mask caps 14 have a thickness that is substantially the same as (i.e., within ±10% of the thickness of) the first hard mask caps 12. In some embodiments, each second hard mask cap 14 has a topmost surface that is coplanar with a topmost surface of each first hard mask cap 12.

After forming the first hard mask caps 12 and the second hard mask caps 14 on the base semiconductor substrate, the base semiconductor substrate is then patterned utilizing the first hard mask cap 12 and the pair of second hard mask caps 14 as a combined etch mask (12/14). The patterning of the base semiconductor substrate includes an etching process such as, for example, RIE. The etch removes portions of the base semiconductor substrate that are not protected by the combined etch masks (12/14) and provides a plurality of semiconductor fins 10F that extend upward from semiconductor substrate 10; the semiconductor fins 10F are located beneath the combined etch masks (12/14). The semiconductor fins 10F and the semiconductor substrate 10 are composed of one of the semiconductor materials mentioned above for base semiconductor substrate. In some embodiments, the semiconductor fins 10F are composed of a compositionally same semiconductor material as the semiconductor substrate 10; in such an embodiment no material interface exists between the semiconductor fins 10F and the semiconductor substrate 10. In one example, the semiconductor fins 10F and the semiconductor substrate 10 are both composed of silicon. In other embodiments, the semiconductor fins 10F are composed of a compositionally different semiconductor material than the semiconductor substrate 10; in such an embodiment a material interface exists between the semiconductor fins 10F and the semiconductor substrate 10. In the drawings, a dotted line is shown between the semiconductor fins 10F and the semiconductor substrate 10 to illustrate the located of a possible material interface between the semiconductor fins 10F and the semiconductor substrate 10. In one example, the semiconductor fins 10F are composed of SiGe or a III-V compound semiconductor, while the semiconductor substrate 10 is composed of silicon.

The term "semiconductor fin" is used in the present application to define a semiconductor material structure that includes a pair of vertical sidewalls that are parallel to each other. A surface is "vertical" if there exists a vertical plane from which the surface does not deviate by more than three times the root mean square roughness of the surface. Each semiconductor fin 10F can have a height from 20 nm to 150 nm, a width from 14 nm to 80 nm, and a length from 15 nm to 1000 nm; although heights and/or widths and/or lengths of the semiconductor fins 10F are possible and can be used in the present application. In some embodiments, the outermost sidewall of the second hard mask cap 14 is vertically aligned to an outermost sidewall of the semiconductor fin 10F that is located directly beneath the combined etch mask (12/14).

Figure 3C:
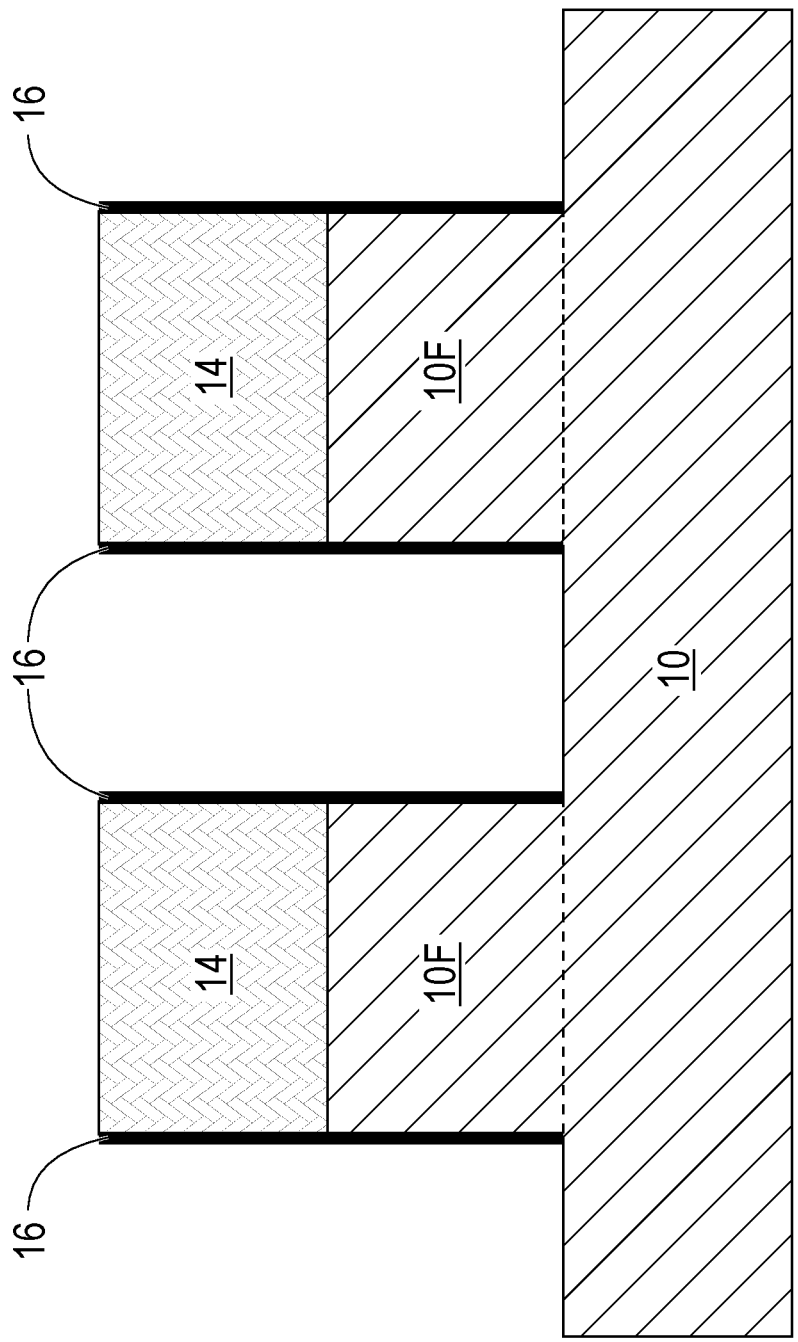

Referring now to FIGS. 3A, 3B and 3C, there are shown the exemplary semiconductor structure of FIGS. 2A, 2B and 2C after forming a first patterned dielectric material liner 16 that includes openings that physically expose a portion of the semiconductor substrate 10 that is located on a first side of each of the semiconductor fins 10F. A first patterned organic planarization layer (OPL) 18 can be present atop the first patterned dielectric material liner 16.

The exemplary semiconductor structure shown in FIGS. 3A, 3B and 3C can be formed by depositing a first dielectric material layer on the exposed surfaces of the exemplary structure shown in FIGS. 2A, 2B, and 2C, i.e., on the semiconductor substrate 10, sidewalls of the semiconductor fins 10F and sidewalls and a topmost surface of the combined etch mask (12/14). The first dielectric material layer can be formed utilizing a deposition process such as, for example, CVD, PECVD or PVD. In some embodiments, the first dielectric material layer is a conformal layer. The term "conformal" denotes that a material layer has a vertical thickness along horizontal surfaces that is substantially the same (i.e., within ±5%) as the lateral thickness along vertical surfaces. The first dielectric material layer is composed of a dielectric material that is compositionally different from the first hard mask material and the second hard mask material mentioned above. In one embodiment, the first dielectric material layer is composed of SiN, SiC, SiOC or SiBCN. The first dielectric material layer can have a thickness from 1 nm to 20 nm; although other thicknesses are contemplated and can be used as the thickness of the first dielectric material layer.

A first OPL is then formed on the first dielectric material layer. The first OPL can be composed of an organic polymer that can include polyacrylate resin, epoxy resin, phenol resin, polyamide resin, polyimide resin, unsaturated polyester resin, polyphenylenether resin, polyphenylenesulfide resin, or benzocyclobutene (BCB. The first OPL can be formed utilizing a deposition process such as, for example, CVD, PECVD or spin-on coating.

Following the deposition of the first dielectric material layer and the first OPL layer, the first OPL layer and the first dielectric material layer are patterned by lithography and etching to provide openings in the first OPL and the first dielectric material layer. The remaining (i.e., non-etched) first OPL constituents the first patterned OPL 18, and the remaining (i.e., non-etched) first dielectric material layer constituents the first dielectric material liner 16.

Figure 4C:
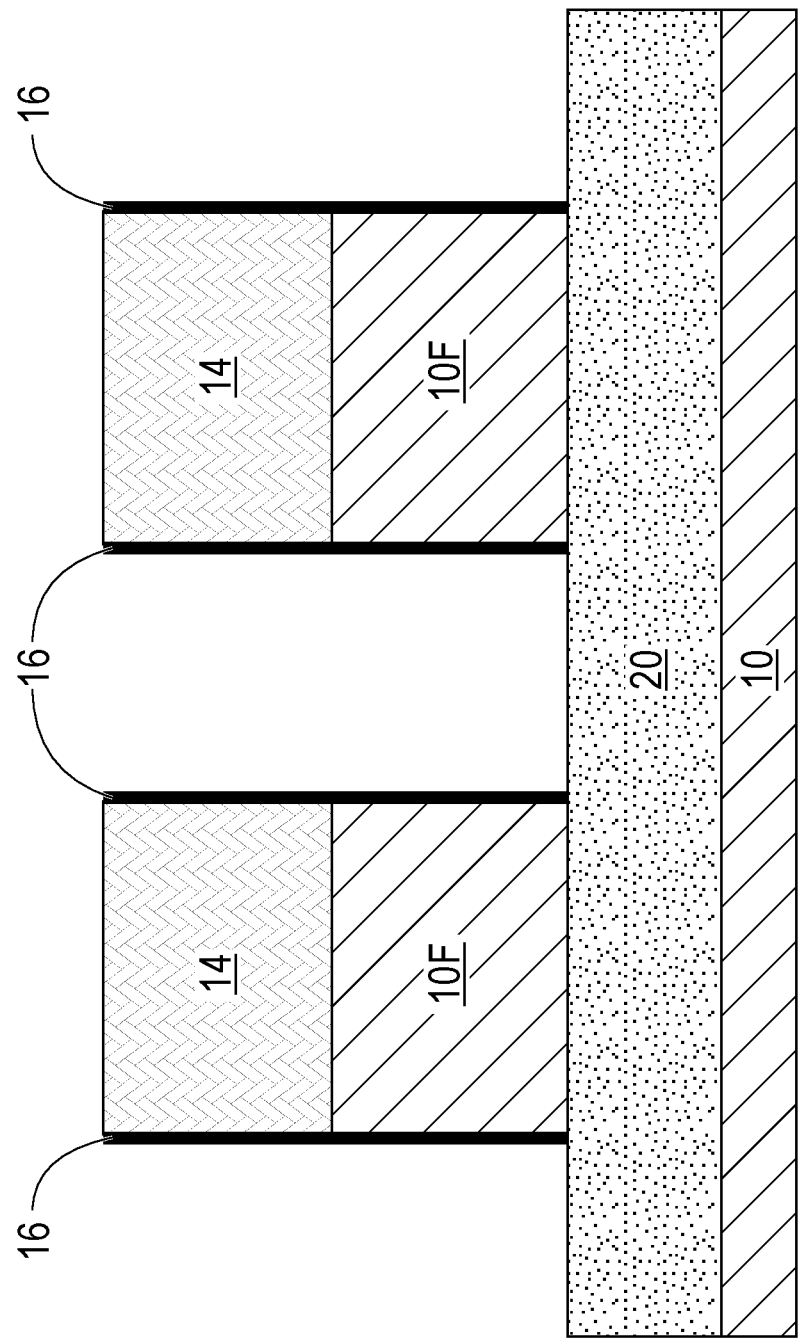

Referring now to FIGS. 4A, 4B and 4C, there are shown the exemplary semiconductor structure of FIGS. 3A, 3B and 3C after forming a first conductivity type bottom source/drain structure 20 in the physically exposed portion of the semiconductor substrate 10 that is located on the first side of each of the semiconductor fins 10F. The first patterned OPL 18 can be removed prior to, during, or after the formation of the first conductivity type bottom source/drain structure 20. The first patterned OPL18 can be removed utilizing a material removal process that is selective in removing the OPL material from the exemplary structure.

The first conductivity type bottom source/drain structure 20 can be formed by first forming a trench into the physically exposed portion of the semiconductor substrate 10 that is located on the first side of each of the semiconductor fins 10F utilizing the first dielectric material liner 16 as an etch mask. The trench can be formed utilizing a combination of an anisotropic etch (i.e., RIE), followed by a lateral etch.

After forming the trench, the first conductivity type bottom source/drain structure 20 is then formed into the trench. The first conductivity type bottom source/drain structure 20 is composed of a first epitaxial semiconductor material that contains a first conductivity type dopant (i.e., n-type dopant or p-type dopant). The first epitaxial semiconductor material includes one of the semiconductor materials mentioned above for the base semiconductor substrate. The first epitaxial semiconductor material can be composed of a semiconductor material that is compositionally the same as, or compositionally different from, the semiconductor material that provides each semiconductor fin 10F.

The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The content of p-type or n-type dopant that is present in the first epitaxial semiconductor material that provides the first conductivity type bottom source/drain structure 20 can be from 1E18 atoms/cm$^3$ to 1E21 atoms/cm$^3$. In one example, the first conductivity type bottom source/drain structure 20 is composed of a boron doped silicon.

The first conductivity type bottom source/drain structure 20 can be formed into the trench utilizing a selective epitaxial growth process in which a semiconductor material is grown only from a physically exposed semiconductor surface. The terms "epitaxially growing and/or depositing" and "epitaxially grown and deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition can result in crystal defects and film cracking. The epitaxial growth that provides the bottom source/drain structure 20 can be performed utilizing any well known precursor gas or gas mixture. Carrier gases like hydrogen, nitrogen, helium and argon can be used. The n-type dopant or a p-type dopant that is present in the first epitaxial semiconductor material that provides the bottom source/drain structure 20 is typically included with the precursor gas during the epitaxial growth process.

Figure 5A:
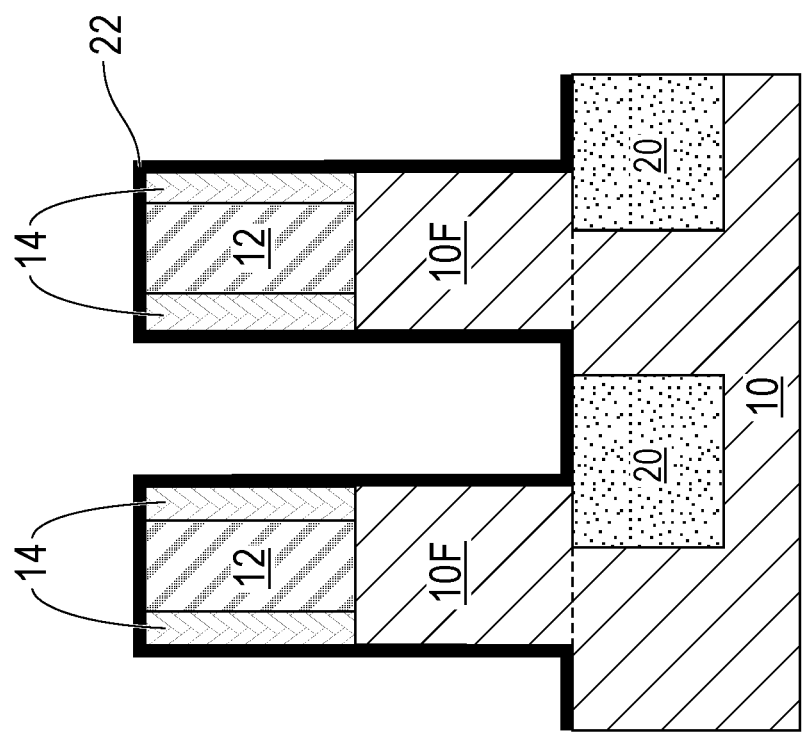
FIGS. 5A, 5B and 5C are various cross sectional views of the exemplary semiconductor structure shown in FIGS. 4A, 4B and 4C after removing the first patterned dielectric material liner, and forming a second dielectric material layer.
Figure 5B:
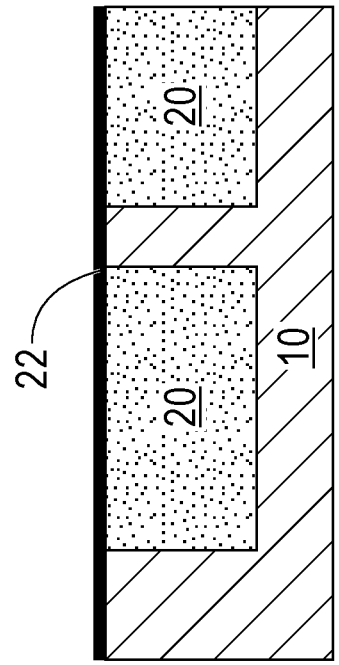
Figure 5C:
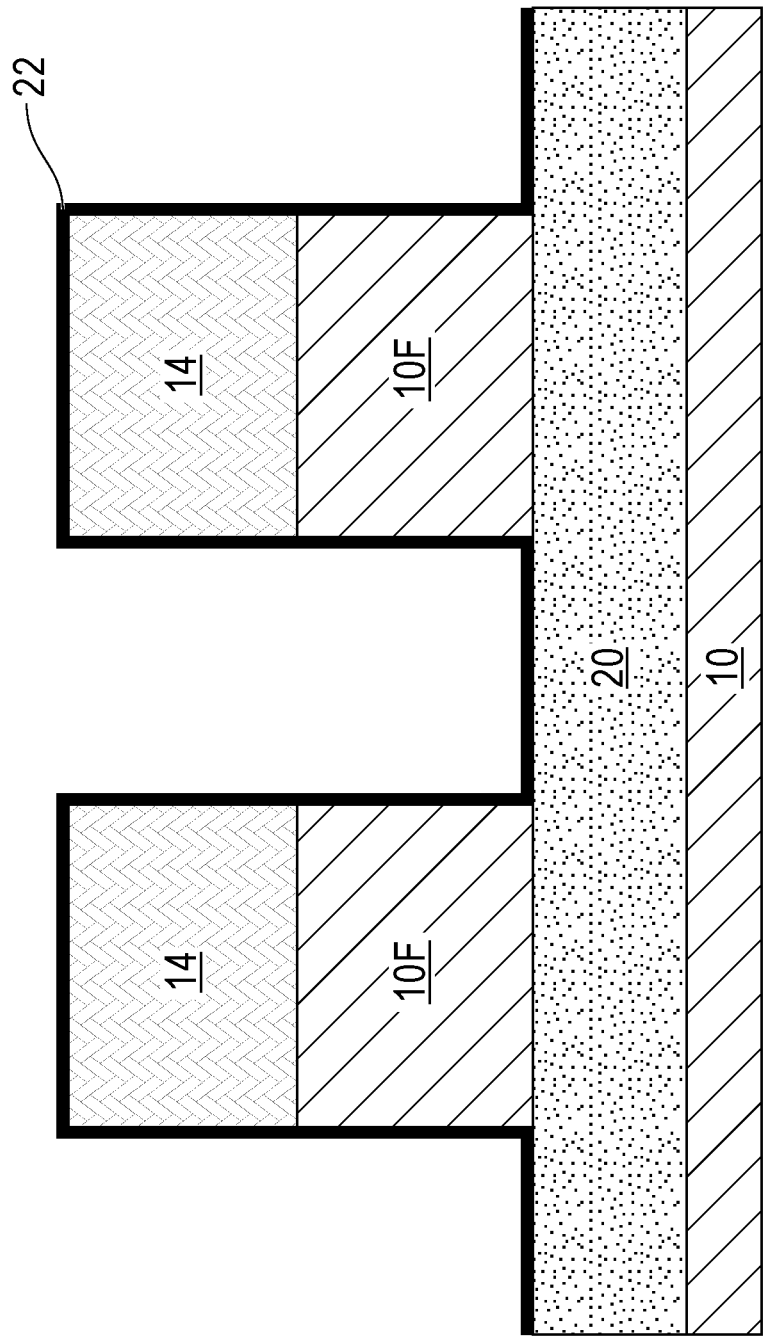

Referring now to FIGS. 5A, 5B and 5C, there are shown the exemplary semiconductor structure of FIGS. 4A, 4B and 4C after removing the first patterned dielectric material liner 16, and forming a second dielectric material layer 22. The first patterned dielectric material liner 16 can be removed from the exemplary semiconductor structure utilizing any material removal process that is selective in removing the first patterned dielectric material liner 16.

The second dielectric material layer 22 is composed of a dielectric material that is compositionally different from the first hard mask material and the second hard mask material mentioned above. In one embodiment, the second dielectric material layer 22 is composed of SiN, SiC, SiOC or SiBCN. The second dielectric material layer 22 can have a thickness from 1 nm to 20 nm; although other thicknesses are contemplated and can be used as the thickness of the first dielectric material layer. The second dielectric material layer 22 is formed on physically exposed surfaces of the semiconductor substrate 10, the bottom source/drain structure 20, the semiconductor fins and the combined etch mask (12/14).

Figure 6C:
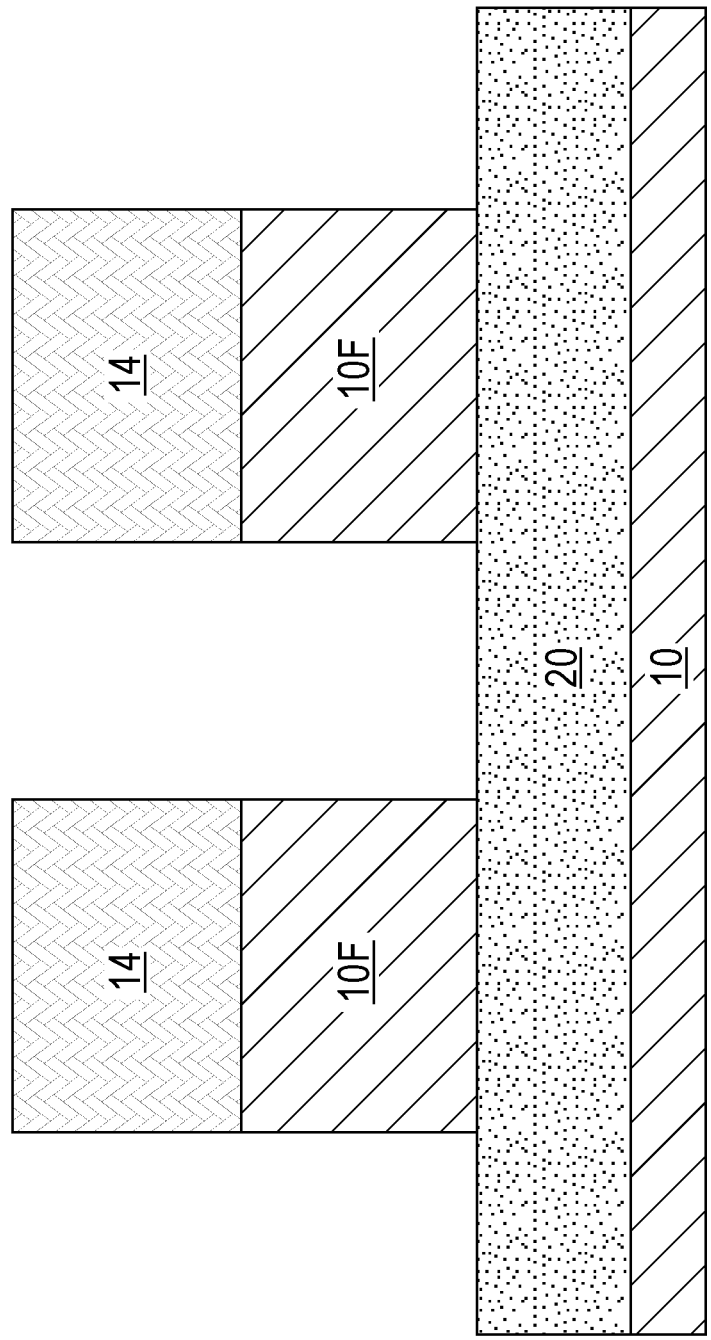

Referring now to FIGS. 6A, 6B and 6C, there are shown the exemplary semiconductor structure of FIGS. 5A, 5B and 5C after patterning the second dielectric material layer 22 to provide a second patterned dielectric material liner (not shown) that has openings that physically expose a portion of the semiconductor substrate 10 that is located on a second side of each of the semiconductor fins 10 (the second side is opposite the first side that was previously processed to include the first conductivity type bottom source/drain structure 20), forming a second conductivity type bottom source/drain structure 24 in the physically exposed portion of the semiconductor substrate 10 that is located on the second side of each of the semiconductor fins 10F, and removing the second patterned dielectric material liner. In one embodiment, the second type bottom source/drain structure 24 is an n-type bottom source/drain structure.

The patterning of the second dielectric material layer 22 includes the processing steps mentioned above for providing first dielectric material liner 18. That is, another OPL is formed on the second dielectric material layer 22, and then the another OPL and the second dielectric material layer 22 are patterned by lithography and etching. The another patterned OPL can be removed prior to, during, or after the formation of the of a second conductivity type bottom source/drain structure 24. The another patterned OPL can be removed utilizing a material removal process that is selective in removing the OPL material from the exemplary structure.

The second conductivity type bottom source/drain structure 24 can be formed by first forming a trench into the physically exposed portion of the semiconductor substrate 10 that is located on the second side of each of the semiconductor fins 10F utilizing the second dielectric material liner as an etch mask. The trench can be formed utilizing a combination of an anisotropic etch (i.e., RIE), followed by a lateral etch.

After forming the trench, the second conductivity type bottom source/drain structure 24 is then formed into the trench. The second conductivity type bottom source/drain structure 24 is composed of a second epitaxial semiconductor material that contains a second conductivity type dopant (i.e., n-type dopant, as defined above, or p-type dopant, as defined above); it is noted that in the present application the first conductivity type is different from the second conductivity. The second epitaxial semiconductor material includes one of the semiconductor materials mentioned above for the base semiconductor substrate. The second epitaxial semiconductor material can be composed of a semiconductor material that is compositionally the same as, or compositionally different from, the semiconductor material that provides each semiconductor fin 10F and/or the first epitaxial semiconductor material that provides the first conductivity type bottom source/drain structure 20.

In one example, the second conductivity type bottom source/drain structure 24 is composed of a phosphorus doped silicon, and the first conductivity type bottom source/drain structure 20 is composed of boron doped silicon. The content of p-type or n-type dopant that is present in the second epitaxial semiconductor material that provides the second conductivity type bottom source/drain structure 24 can be from 1E18 atoms/cm$^3$ to 1E21 atoms/cm$^3$. The second conductivity type bottom source/drain structure 24 can be formed into the trench utilizing a selective epitaxial growth process as defined above.

After forming the second conductivity type bottom source/drain structure 24, the second dielectric material liner can be removed utilizing a material removal process that is selective in removing the second dielectric material liner from the exemplary structure.

Figures 7A, 7B:
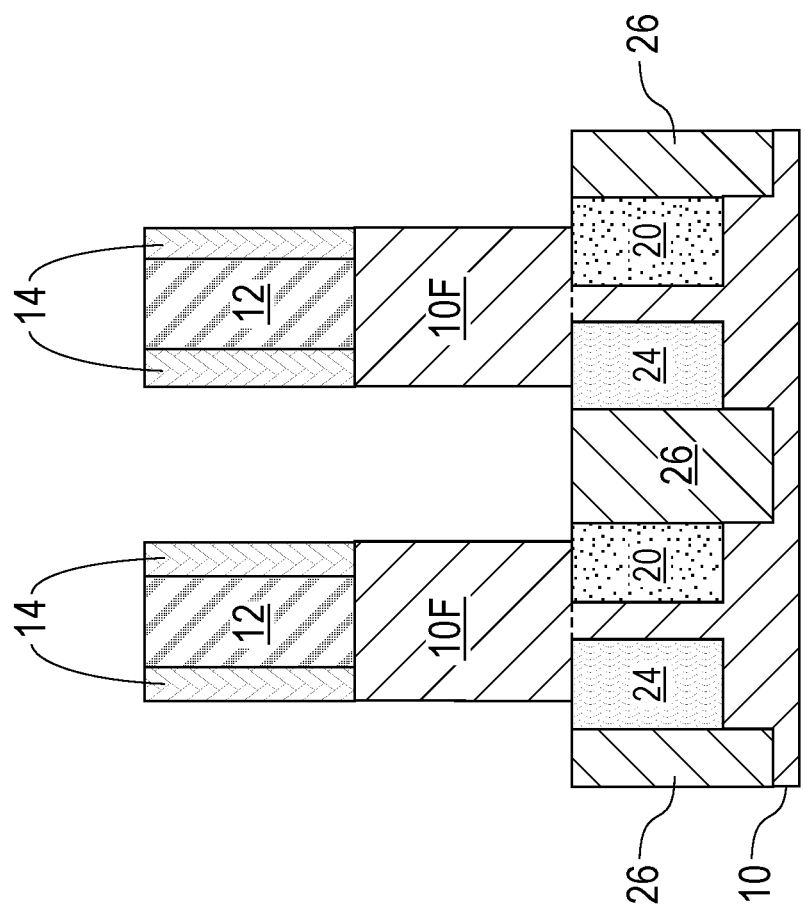

Referring now to FIGS. 7A, 7B and 7C, there are shown the exemplary semiconductor structure of FIGS. 6A, 6B and 6C after forming a shallow trench isolation (STI) structure 26 in the semiconductor substrate 10. The STI structure 26 can be formed by forming a shallow trench into the semiconductor substrate 10 (the trench is formed in a location of the semiconductor substrate 10 that is located between each semiconductor fin 10F), and then filling the trench with a trench dielectric material such as, for example, silicon dioxide. During trench formation, a portion of both the first and second conductivity type bottom source/drain structure 20, 24 can be removed. An etch back process can follow the filling of the trench with the trench dielectric material. The STI structure 26, that is located between each neighboring pair of semiconductor fins 10F, isolates the first conductivity type bottom source/drain structure 20 from the second conductivity type bottom source/drain structure 24.

Figure 8C:
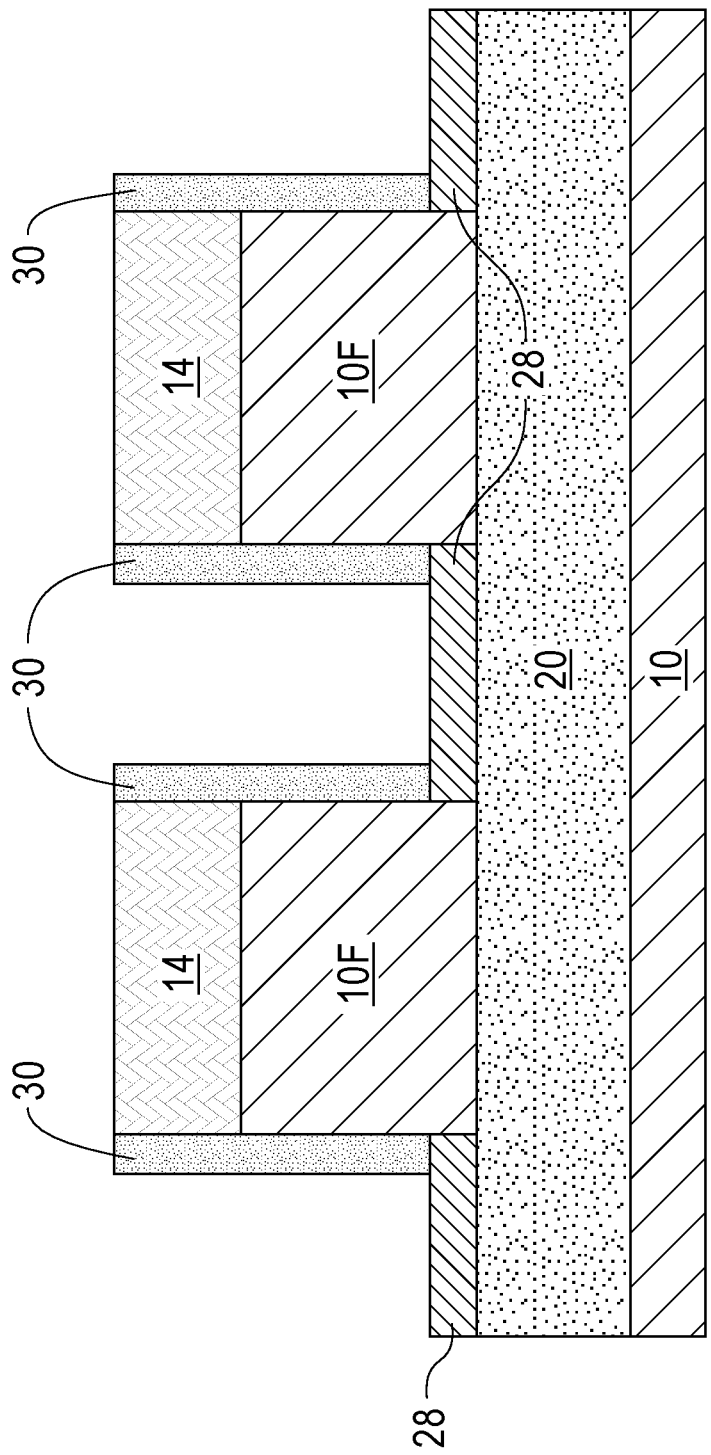

Referring now to FIGS. 8A, 8B and 8C, there are shown the exemplary semiconductor structure of FIGS. 7A, 7B and 7C after forming a bottom spacer 28 and gate structure 30. Also, shown in FIGS. 8A, 8B, and 8C is the present of a second patterned OPL 32. The bottom spacer 28 has a sidewall that directly contacts a lower portion of a sidewall of each semiconductor fin 10F, and the bottom spacer 28 is formed above the STI structure 26, the second conductivity type bottom source/drain structure 24, and the first conductivity type bottom source/drain structure 20.

The bottom spacer 28 can be composed of any dielectric spacer material including, for example, silicon dioxide, silicon nitride, or silicon oxynitride. The dielectric spacer material that provides the bottom spacer 28 can be composed of a low k dielectric material (i.e., a dielectric material having a dielectric constant that is less than 4.0, all dielectric constants mentioned herein as measured in a vacuum). An example of a low k dielectric material that can be used as the bottom spacer 28 includes a dielectric material including atoms of silicon, boron, carbon and nitrogen.

The bottom spacer 28 can be formed utilizing a deposition process such as, for example, chemical vapor deposition or plasma enhanced chemical vapor deposition. In some instances, an etch back process may follow the deposition of the dielectric spacer material that provides the bottom spacer 28. The bottom spacer 28 can have a thickness from 5 nm to 15 nm. Other thicknesses that are lesser than, or greater than, the aforementioned thickness range can also be employed in the present application as the thickness of the bottom spacer 28 as long as the height of the bottom spacer 28 is not greater than the height of the semiconductor fins 10F, and there is enough space to form other components of a VFET above the bottom spacer 28 and laterally adjacent to the semiconductor fins 10F.

Gate structure 30 is then formed laterally adjacent to an upper portion of each semiconductor fin 10F and laterally adjacent to the combined etch masks (12/14). Gate structure 30 includes a high-k gate dielectric material and a work function metal as a gate electrode. The work function metal can be an n-type work function metal or a p-type work function metal. The term "high-k gate dielectric material" denotes a gate dielectric material having a dielectric constant greater than 4.0; all dielectric constants mentioned herein are measured in a vacuum. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The high-k gate dielectric material of gate structure 30 can be formed by any deposition process including, for example, chemical vapor deposition (CVD), plasma enhanced chemical vapor deposition (PECVD), physical vapor deposition (PVD), sputtering, or atomic layer deposition (ALD). In one embodiment of the present application, the high-k gate dielectric material can have a thickness in a range from 1 nm to 10 nm. Other thicknesses that are lesser than, or greater than, the aforementioned thickness range can also be employed for high-k gate dielectric material. The high-k gate dielectric material typically has a conformal thickness, as defined above.

In some embodiments (not shown), an interfacial dielectric material can be formed prior to forming the high-k gate dielectric material. When present, the interfacial dielectric material is composed of silicon dioxide. The interfacial dielectric material can be formed utilizing a thermal oxidation (i.e., growth) process. The interfacial dielectric material can have a thickness from 0.5 nm to 2.0 nm.

The n-type work function metal that can be used as the gate electrode of gate structure 30 effectuates an n-type threshold voltage shift. "N-type threshold voltage shift" as used herein means a shift in the Fermi energy of an n-type semiconductor device towards a conduction band of silicon in a silicon-containing material of the n-type semiconductor device. The "conduction band" is the lowest lying electron energy band of the doped material that is not completely filled with electrons. In one embodiment, the work function of the n-type work function metal ranges from 4.1 eV to 4.3 eV. In one embodiment, the n-type work function metal is composed of at least one of titanium aluminum, titanium aluminum carbide, tantalum nitride, titanium nitride, hafnium nitride, hafnium silicon, or combinations and thereof. The n-type work function metal can be a single material layer or a multi-material layer.

The p-type work function metal that can be used as the gate electrode of gate structure 30 effectuates a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing material of the p-type semiconductor device. A "valence band" is the highest range of electron energies where electrons are normally present at absolute zero. In one embodiment, the p-type work function metal can be composed of titanium and its nitride or carbide. In one specific embodiment, the p-type work function metal is composed of titanium nitride. The p-type work function metal can also be composed of titanium aluminum nitride, tantalum nitride, ruthenium, platinum, molybdenum, cobalt, and alloys and combinations or thereof. The p-type work function metal can be a single material layer or a multi-material layer.

The work function metals that can be used as the gate electrode of gate structure 30 can be formed utilizing a deposition process such as, for example, chemical vapor deposition (CVD), plasma enhanced chemical vapor deposition (PECVD), physical vapor deposition (PVD), sputtering, or atomic layer deposition (ALD). In one embodiment, the work function metals that can be used as the gate electrode of gate structure 30 can have a thickness in a range from 1 nm to 10 nm. Other thicknesses that are lesser than, or greater than, the aforementioned thickness range can also be employed for each of work function metals that can be used as the gate electrode of gate structure 30.

The gate structure 30 can be formed utilizing techniques that are well known to one skilled in the art. In one embodiment, the gate structures can be formed by first forming a continuous layer of the high-k gate dielectric material 26 on the entire structure shown in FIGS. 7A, 7B and 7C. After forming the continuous layer of the high-k gate dielectric material, the work function metal can be formed. After forming the work function metal, the work function metal and the high-k gate dielectric material can be removed from the topmost surface of the combined etch mask (12/14).

After forming the gate structure 30, the second patterned OPL 32 is formed. The second patterned OPL 32 includes one of the polymeric materials mentioned above for first patterned OPL 18. The second patterned OPL 32 can be formed utilizing one of the deposition processes mentioned above for forming the first patterned OPL 18, and thereafter a patterning process can be used. The second patterned OPL 32 has an opening 34 as shown in FIG. 8B. An etch is then performed to cut the gate structure 30 that is located between neighboring semiconductor fins 12.

After cutting the gate structure 30 between neighboring semiconductor fins 12, the patterned second OPL layer 32 can be removed utilizing a material removal process such as, for example, ashing.

Figure 9C:
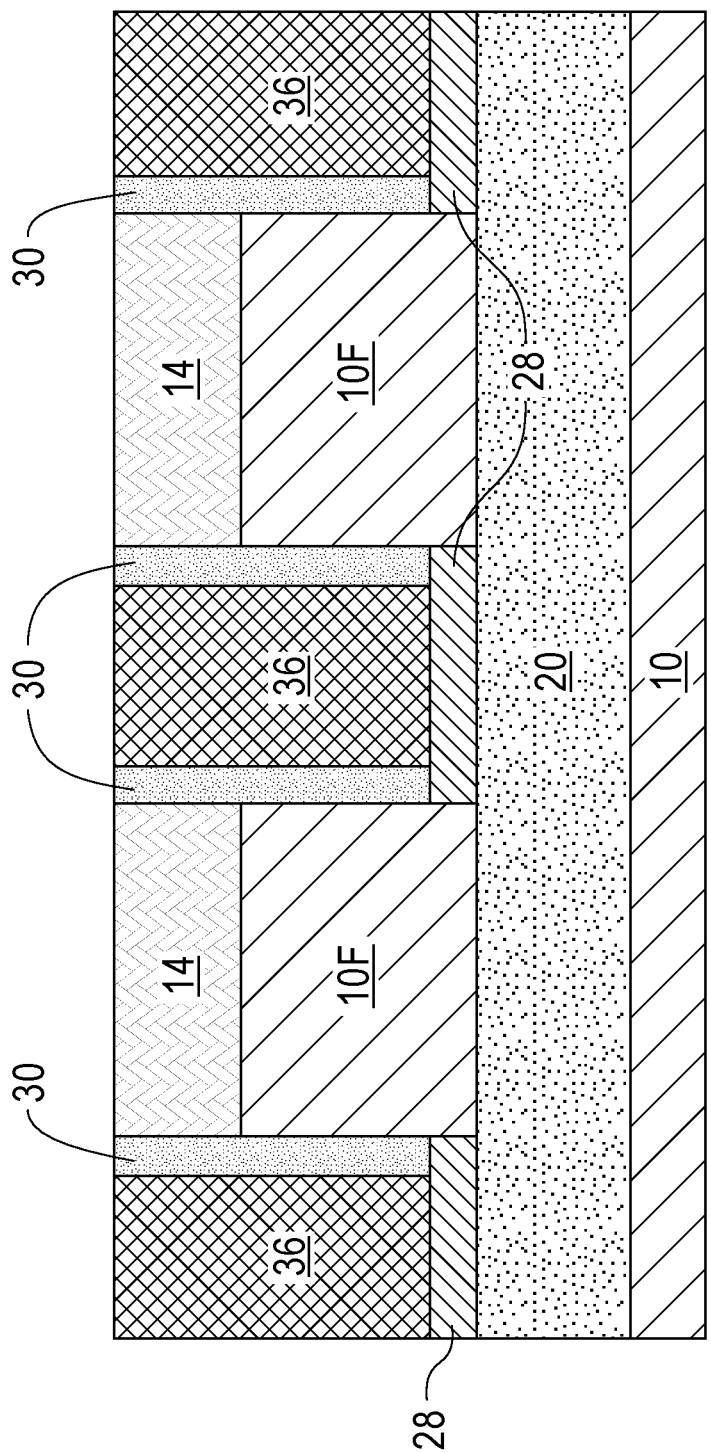

Referring now to FIGS. 9A, 9B and 9C, there are shown the exemplary semiconductor structure of FIGS. 8A, 8B and 8C after forming an interlayer dielectric (ILD) material layer 36. The ILD material layer 36 is formed laterally adjacent to the gate structure 30 and is located between each cut gate structure 30 that is located between neighboring semiconductor fins 10F.

The ILD material layer 36 is composed of a dielectric material which differs from at least the first hard mask cap 12. The ILD material layer 36 can include, for example, undoped silicate glass (USG), fluorosilicate glass (FSG), borophosphosilicate glass (BPSG), a spin-on low k dielectric layer, a chemical vapor deposition (CVD) low-k dielectric layer or any combination thereof. In another embodiment, a self-planarizing material such as a spin-on glass (SOG) or a spin-on low-k dielectric material such as SiLK™ can be used as the ILD material layer 36; the term "low-k" denotes a dielectric material having a dielectric constant of less than 4.0. In one embodiment, ILD material layer 36 can be formed utilizing a deposition process including, for example, chemical vapor deposition (CVD), plasma enhanced chemical vapor deposition (PECVD), evaporation or spin-on coating. Following deposition of the ILD material layer 36, a planarization process such as, for example, chemical mechanical polishing (CMP), can employed; a planarization process is not needed when a self-planarizing material is employed as the ILD material layer 36.

At this point of the present application, the ILD material layer 36 has a topmost surface that is coplanar with a topmost surface of the gate structures 30 as well as a topmost surface of the combined etch mask (12/14).

Figures 10A, 10B:
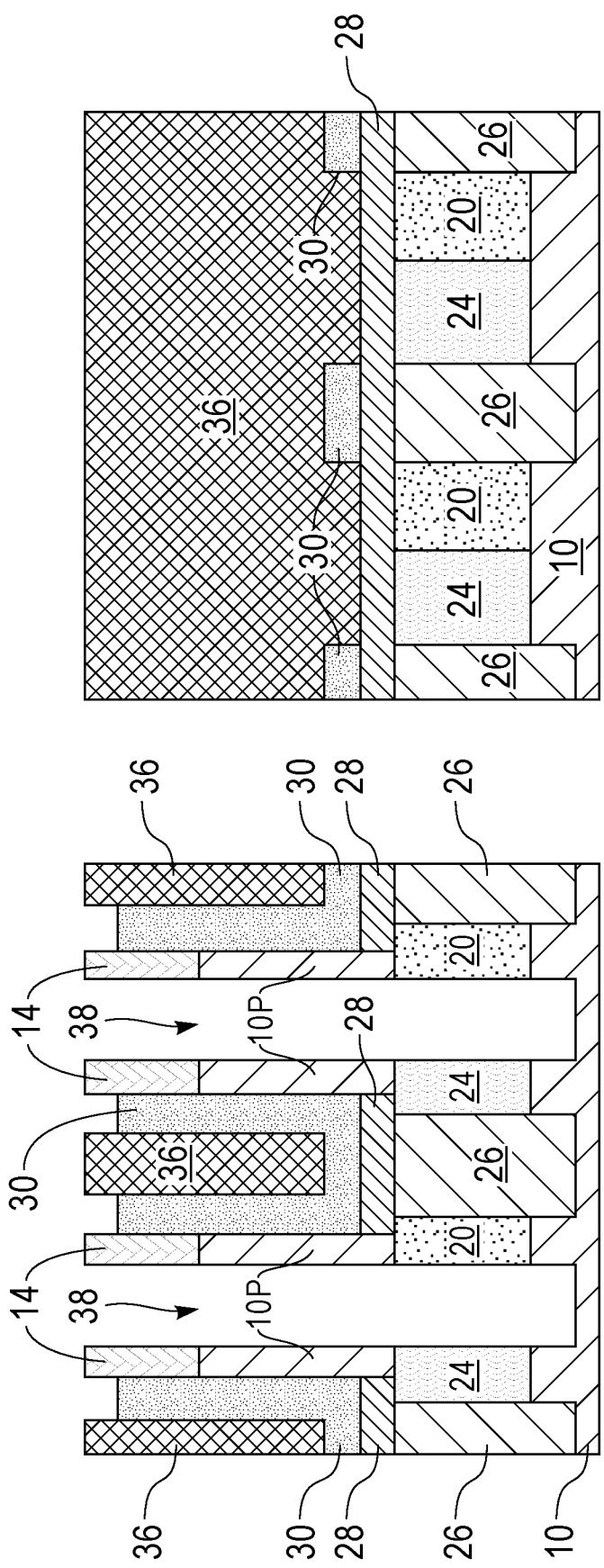
FIGS. 10A, 10B and 10C are various cross sectional views of the exemplary semiconductor structure shown in FIGS. 9A, 9B and 9C after removing each first hard mask cap, an underlying portion of each semiconductor fin and an underlying portion of the semiconductor substrate to provide a gap that separates a first semiconductor pillar of a first conductivity type VFET from a second semiconductor pillar of a second conductivity type VFET.
Figure 10C:
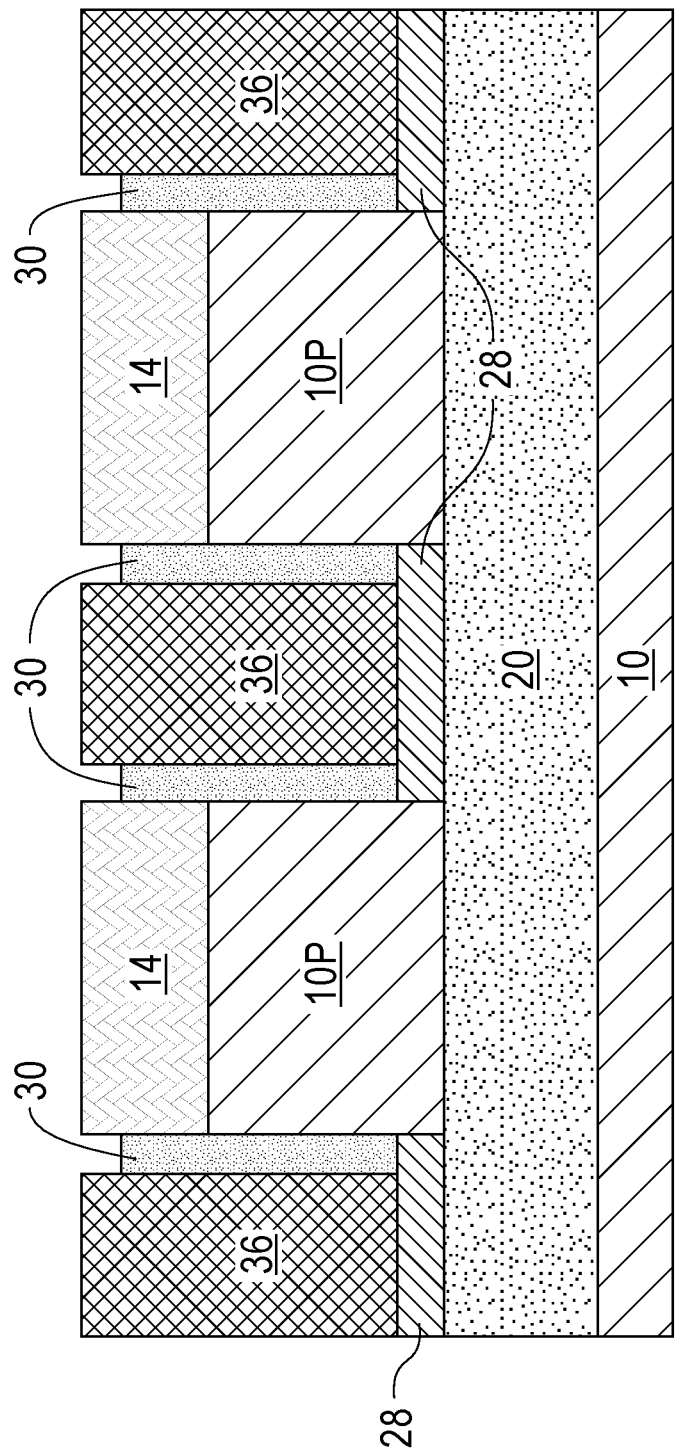

Referring now to FIGS. 10A, 10B and 10C, there are shown the exemplary semiconductor of FIGS. 9A, 9B and 9C after removing each first hard mask cap 12, an underlying portion of each semiconductor fin 10F and an underlying portion of the semiconductor substrate 10 to provide a gap 38 that separates a first semiconductor fin of a first conductivity type VFET (the first VFET includes the first conductivity type bottom source/drain structure 20) and from second semiconductor pillar of a second conductivity type VFET (the second VFET includes the second conductivity type bottom source/drain structure 24). An upper portion of each gate structure 30 can be removed following the formation of the gap 38.

The first hard mask caps 12 can be removed utilizing an etching process that is selective in removing the first hard mask material from the structure. The underlying portion of each semiconductor fin 10F and the underlying portion of the semiconductor substrate 10 can be removed utilizing one or more etching processes that are selective in removing the semiconductor material that provides the semiconductor fins 10F and the semiconductor substrate 10. In one example, the underlying portion of each semiconductor fin 10F and the underlying portion of the semiconductor substrate 10 can be removed utilizing a reactive ion etch; portions of the first conductivity type bottom source/drain structure 20 and the second conductivity type bottom source/drain structure 24 can be removed during this step of the present application. After removing the portion of each semiconductor fin 10F that was located beneath each first hard mask cap 12, a portion of the semiconductor fins 10F remains beneath each second hard mask cap 14. The remaining portion of the semiconductor fins 10F that is present beneath the second hard mask caps 14 can be referred to as a semiconductor pillar 10P; the semiconductor pillar 10P defines a channel (or body) region of each VFET.

The removal of the upper portion of each gate structure 30 that follows the formation of the gap 38 can include a recess etching process that is selective in removing the upper portion of each gate structure 30.

Figure 11C:
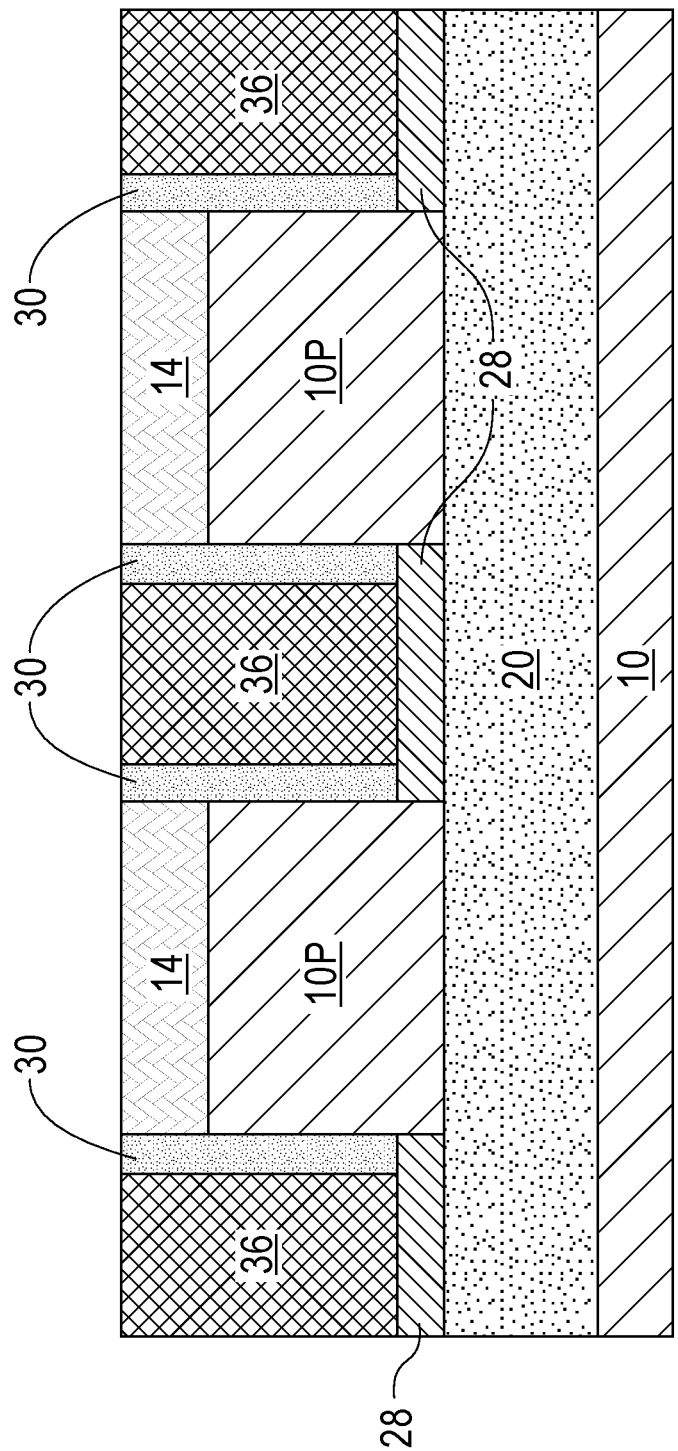

Referring now to FIGS. 11A, 11B and 11C, there are shown the exemplary semiconductor of FIGS. 10A, 10B and 10C after filling the gap 38 with a dielectric material. The dielectric material filled gap is referred to herein as a dielectric spacer 40. The dielectric material that provides the dielectric spacer 40 is compositionally different from the second hard mask cap 14 and can include, for example, $SiO_2$, SiC, SiOC or a low-k (i.e., dielectric constant less than 4.0) oxide. The filling of the gap 38 with a dielectric material can include a deposition process, following by a planarization process; planarization process stops on a topmost surface of the recessed gate structure 30. The dielectric spacer 40 separates a first semiconductor pillar of a first conductivity type VFET from a second semiconductor pillar of a second conductivity type VFET.

Figures 12A, 12B:
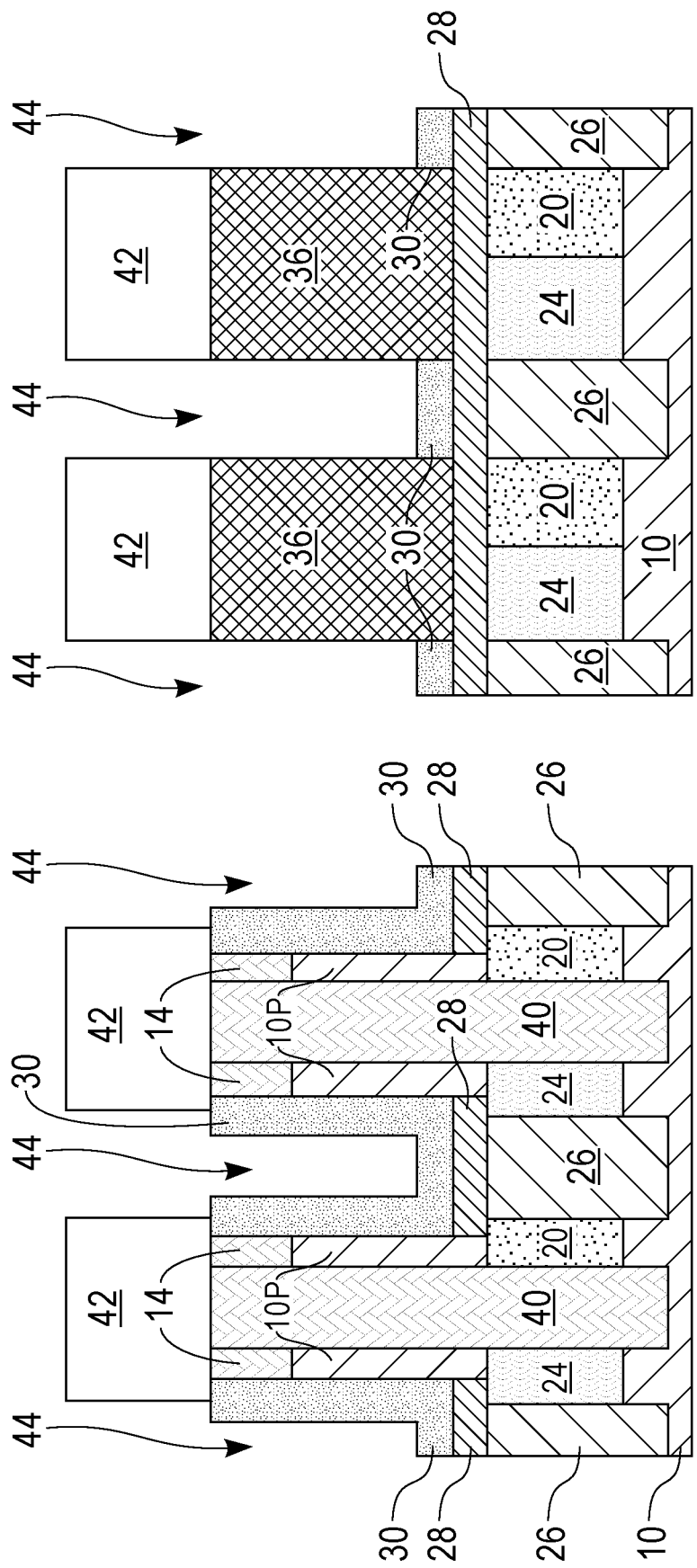
FIGS. 12A, 12B and 12C are various cross sectional views of the exemplary semiconductor structure shown in FIGS. 11A, 11B and 11C after forming gate contact trenches.
Figure 12C:
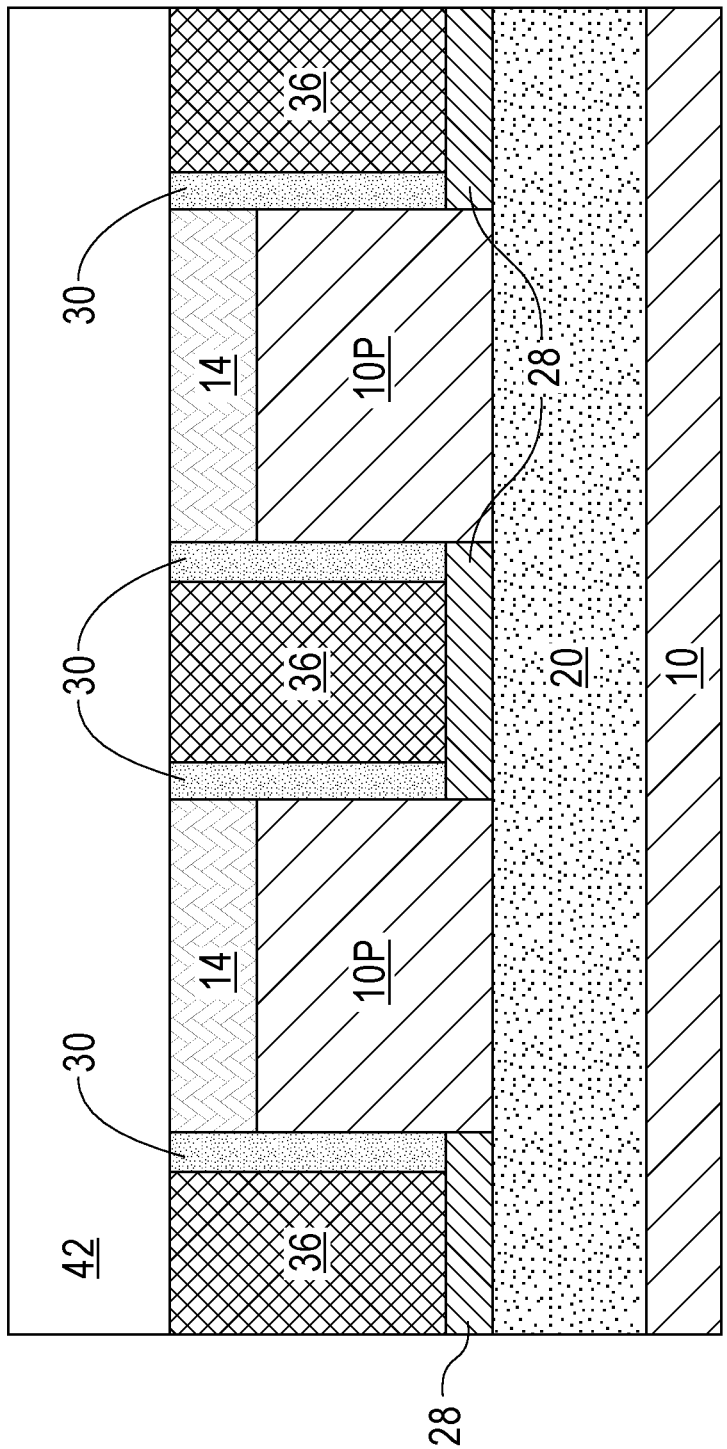

Referring now to FIGS. 12A, 12B and 12C, there are shown the exemplary semiconductor of FIGS. 11A, 11B and 11C after forming gate contact trenches 44. The gate contact trenches 44 can be formed by forming a third patterned OPL 42 above each dielectric spacer, and the removing the ILD material layer 36 that is not protected by the third patterned OPL 42. The third patterned OPL 42 includes one of the polymeric materials mentioned above for the first patterned OPL 18 and it can be formed utilizing the technique mentioned above for forming the first patterned OPL 18. The ILD material layer 36 that is not protected by the third patterned OPL 42 can be removed utilizing an etching process that is selective for removing the ILD material 36. After forming the gate contact trenches 44, the third patterned OPL 42 can be removed utilizing a material removal process such as, for example, ashing.

Figure 13C:
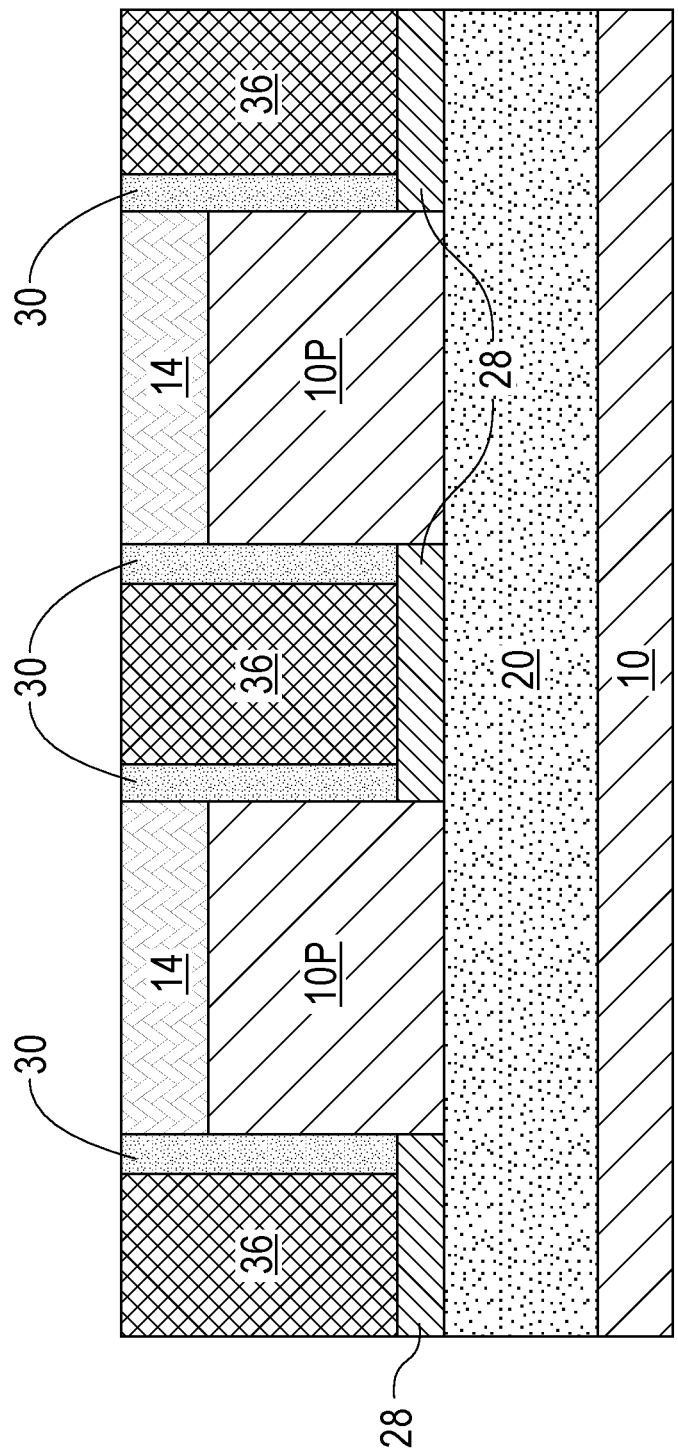

Referring now to FIGS. 13A, 13B and 13C, there are shown the exemplary semiconductor of FIGS. 12A, 12B and 12C after forming a buried wordline contact structure 46 in a lower portion of each of the gate contact trenches 44; the buried wordline contact structure 46 is formed on a physically exposed portion of the gate structure 30. Each buried wordline contact structure 46 is composed of a high conductance metal. By "high conductance metal" it is meant a metal that has a bulk conductivity of $1.79 \times 10^7$ S/m at 20° C. or greater. Illustrative examples of high conductance metals that can be used as the buried wordline contact structure 46 include ruthenium (Ru) or tungsten (W). Each buried wordline contact structure 46 is formed by filling the gate contact trenches 44 with high conductance metal and then recessing the high conductance metal. As is shown, the gate structure 30 of a first conductivity type VFET (which includes first conductivity type bottom source/drain structure 20) and a second conductivity type VFET (which includes second conductivity type bottom source/drain structure 24) in two adjacent memory cells share the same buried wordline structure 46.

Figure 14B:
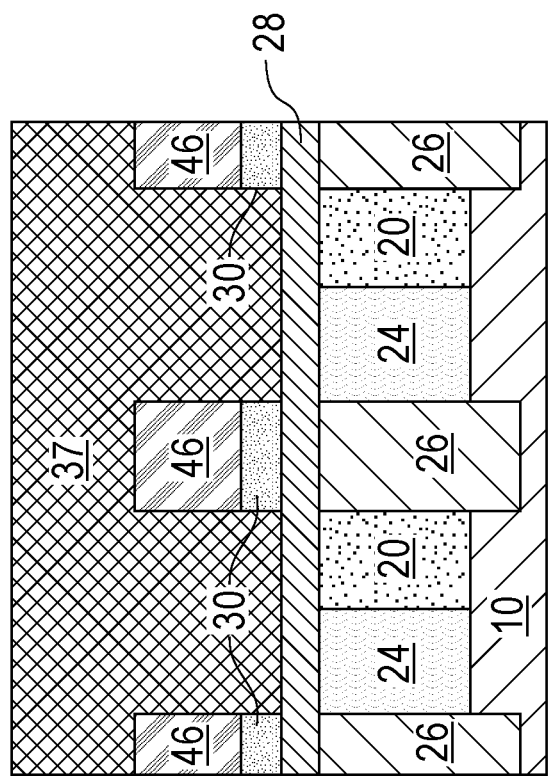
FIGS. 14A, 14B and 14C are various cross sectional views of the exemplary semiconductor structure shown in FIGS. 13A, 13B and 13C after forming a ILD material on each of the buried wordline contact structures, wherein the ILD material fills in an upper portion of each of the gate contact trenches.
Figure 14A:
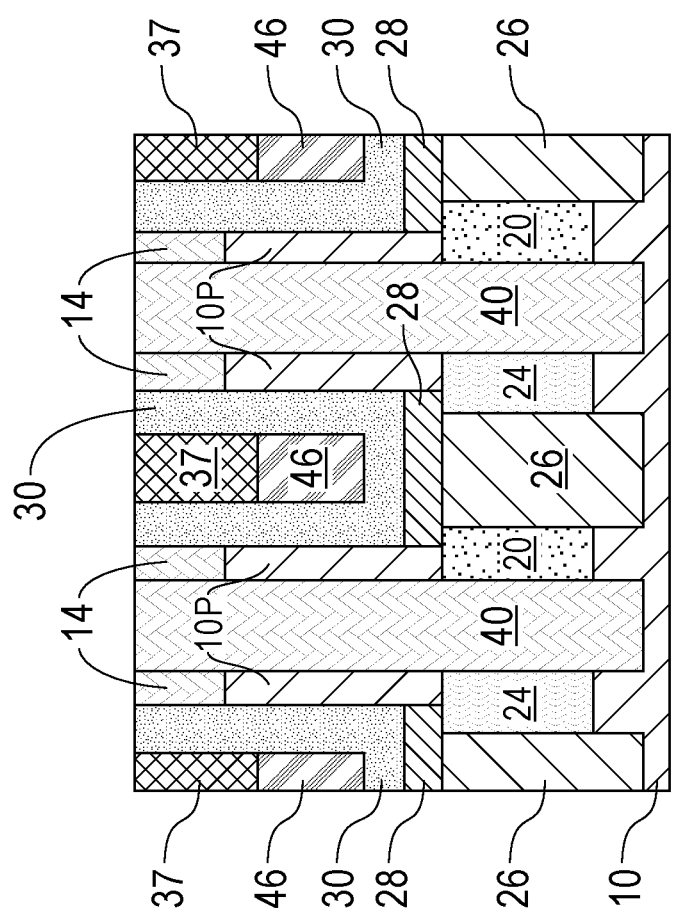
Figure 14C:
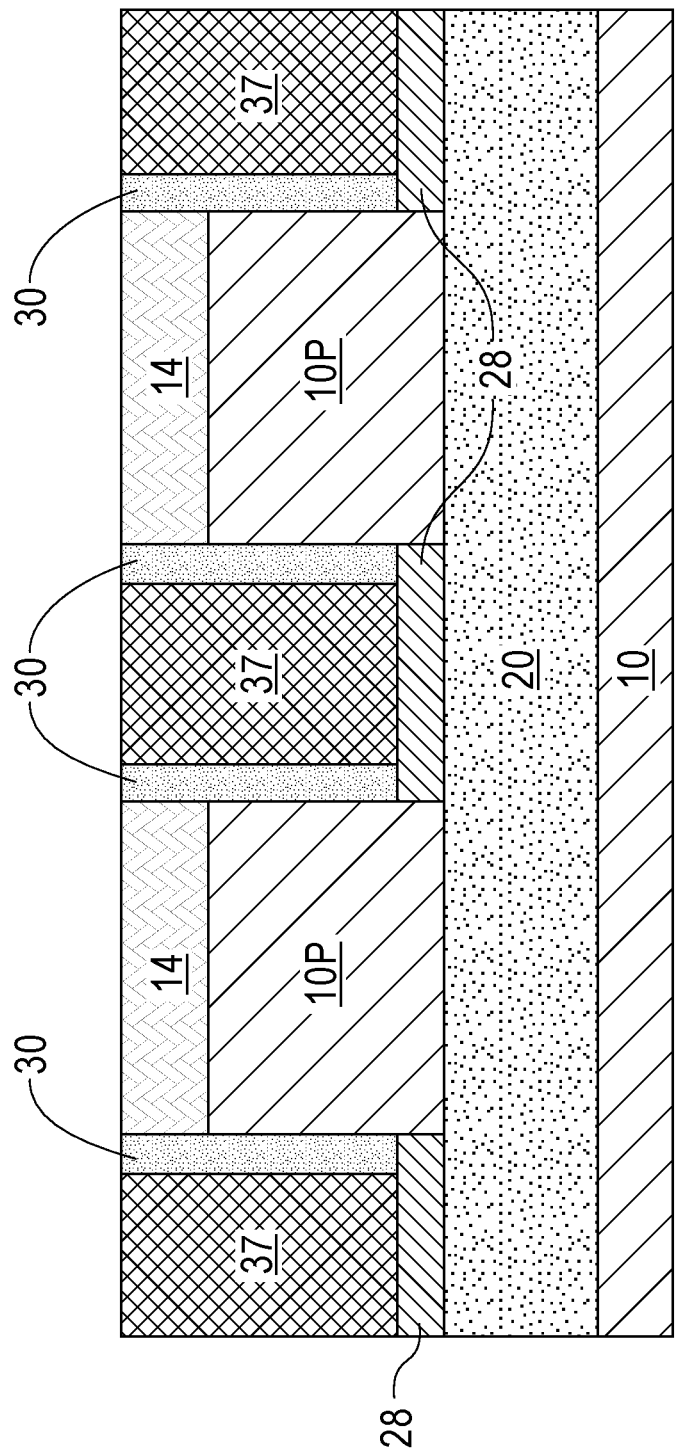

Referring now to FIGS. 14A, 14B and 14C, there are shown the exemplary semiconductor of FIGS. 13A, 13B and 13C after forming ILD material on each of the buried wordline contact structures 46, wherein the ILD material fills in an upper portion of the gate contact trenches 44. In the drawings, element 37 is used to denote a combination of ILD material layer 36 and the ILD material that is formed in each of the gate contact trenches 44. The ILD material may include one of the ILD materials mentioned above for ILD material layer 36. Typically, the ILD material that fills each of the gate contact trenches 44 is the same as that of ILD material layer 36. The ILD material that fills each of the gate contact trenches 44 can be formed utilizing ALD followed by an isotropic etch back process.

Figure 15A:
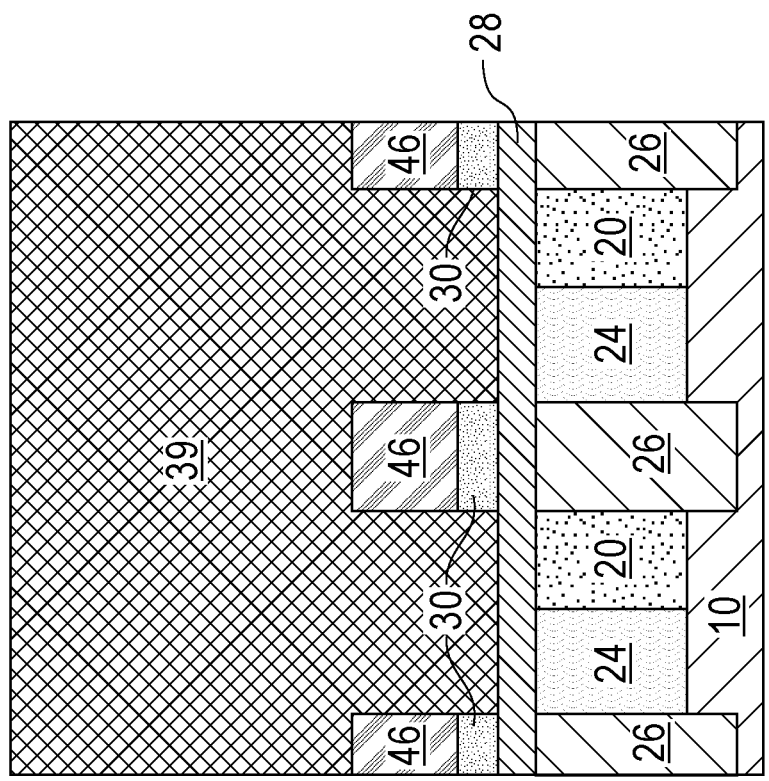
FIGS. 15A, 15B and 15C are various cross sectional views of the exemplary semiconductor structure shown in FIGS. 14A, 14B and 14C after further processing including, removing the second hard mask caps, recessing an upper portion of the gate structure, forming a top spacer, forming a first conductivity type top source/drain structure, and forming a second conductivity type top source/drain structure, forming a bottom electrode, forming a memory element and forming contact structures.
Figure 15B:
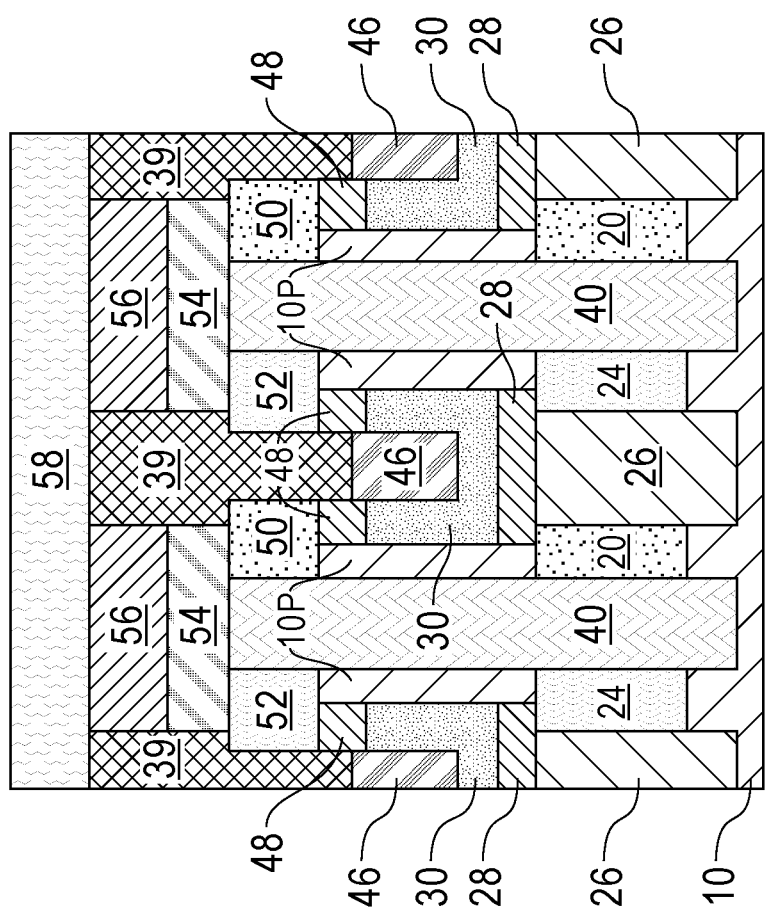
Figure 15C:
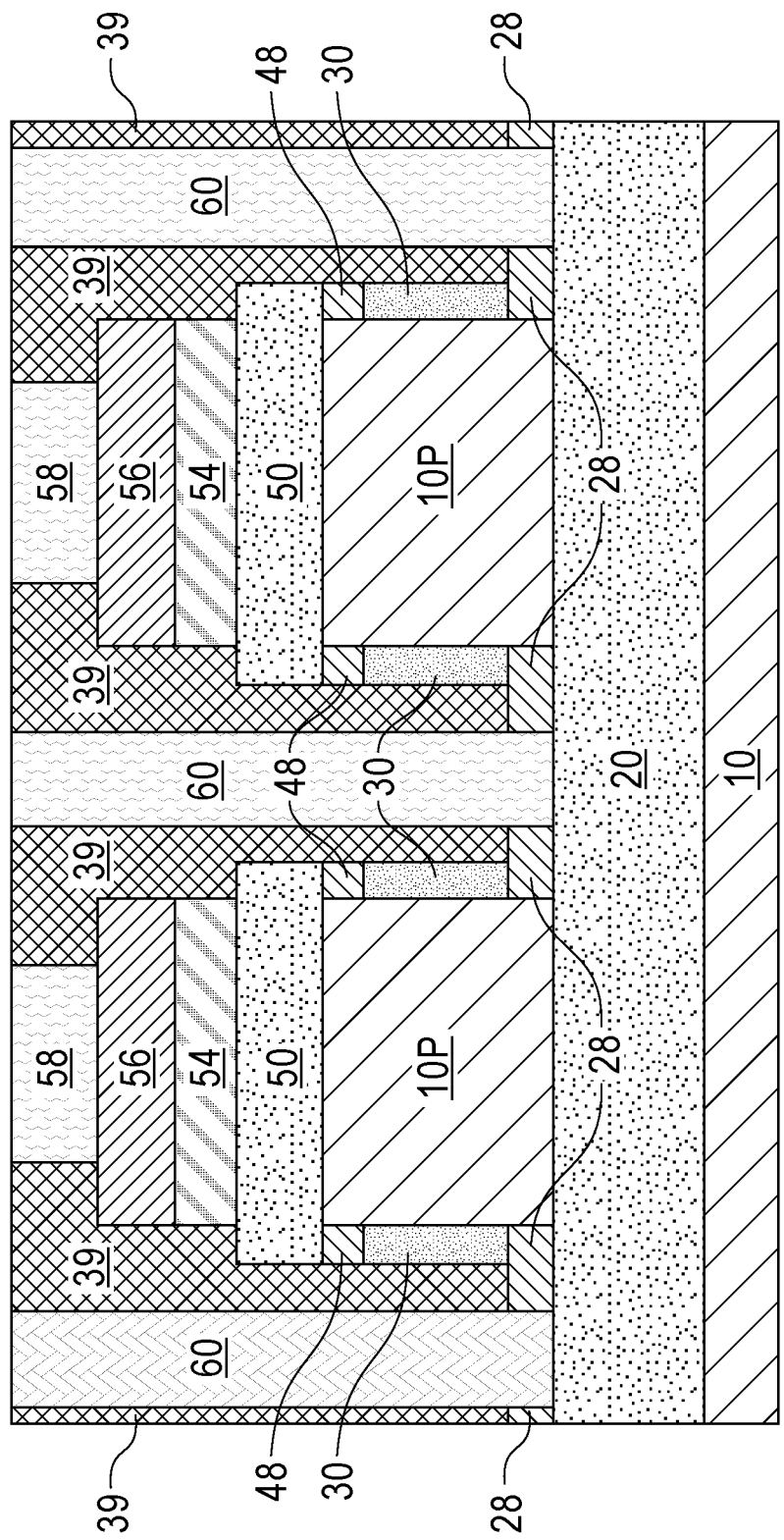

Referring now to FIGS. 15A, 15B and 15C, there are shown the exemplary semiconductor of FIGS. 14A, 14B and 14C after further processing including, removing the second hard mask caps 14, recessing an upper portion of the gate structure 30, forming a top spacer 48, forming a first conductivity type top source/drain structure 50, and forming a second conductivity type top source/drain structure 52, forming a bottom electrode 54, forming a memory element 56 and forming contact structures 58, 60. Collectively elements 54 and 56 provide a memory cell of the present application.

The second hard mask caps 14 can be removed utilizing a material removal process that is selective in removing each of the second hard mask caps 14. A topmost surface of each of the semiconductor pillars 10P is physically exposed after removing the second hard mask caps 14. The recessing of each of the gate structures 30 includes an etching process that is selective in removing an upper portion of the gate structures 30. An upper sidewall portion of each of the semiconductor pillars 10P is physically exposed after this recessing step.

The top spacer 48 is formed laterally adjacent to, and in direct physically contact with, the physical exposed upper sidewall portion of each semiconductor pillar 10P. The top spacer 48 can include one of the dielectric spacer material mentioned above for the bottom spacer 28. The top spacer 48 can be formed utilizing one of the deposition processes mentioned above for forming the bottom spacer 28. The top spacer 48 is formed directly on a topmost surface of the remaining gate structures 30.

After forming the top spacer 48, the first conductivity type top source/drain structure 50 and the second conductivity type top source/drain structure 52 can be formed. The order of forming the first conductivity type top source/drain structure 50 and the second conductivity type top source/drain structure 52 can vary and is not critical to the present application.

The first conductivity type top source/drain structure 50 is formed on a physically exposed topmost surface of the semiconductor pillar 10P that directly contact the first conductivity type bottom source/drain structure 20. The first conductivity type top source/drain structure 50 includes a third epitaxial semiconductor material and a first conductivity type dopant. The third epitaxial semiconductor material includes one of the semiconductor materials mentioned above for the base semiconductor substrate. The semiconductor material that provides the third epitaxial semiconductor material may be the same or different from the semiconductor material that provides the semiconductor pillar 10P and/or the first conductivity type bottom source/drain structure 20. The first conductivity type top source/drain structure 50 can be formed utilizing a selective epitaxial growth process as mentioned above.

The second conductivity type top source/drain structure 52 is formed on a physically exposed topmost surface of the semiconductor pillar 10P that directly contact the second conductivity type bottom source/drain structure 24. The second conductivity type top source/drain structure 52 includes a fourth epitaxial semiconductor material and a second conductivity type dopant. The fourth epitaxial semiconductor material includes one of the semiconductor materials mentioned above for the base semiconductor substrate. The semiconductor material that provides the fourth epitaxial semiconductor material may be the same or different from the semiconductor material that provides the semiconductor pillar 10P and/or the second conductivity type bottom source/drain structure 24. The second conductivity type top source/drain structure 52 can be formed utilizing a selective epitaxial growth process as mentioned above.

Next, the bottom electrode 54 and the memory element 56 are formed by deposition and patterning. Bottom electrode 54 can be composed of a conductive material such as, for example, Ta, TaN, Ti, TiN, Ru, RuN, RuTa, RuTaN, Co, CoWP, CoN, W, WN or any combination thereof. The bottom electrode 54 can be formed by a deposition process such as, for example, sputtering, chemical vapor deposition (CVD), or plasma enhanced chemical vapor deposition (PECVD). The bottom electrode 54 is formed on the second conductivity type top source/drain structure 52, the dielectric spacer 40 and the first conductivity top source/drain structure 50.

Memory element 50 is a component of one of a ferroelectric memory (FE) device, a resistive random access memory (ReRAM) device, a magnetoresistive random access memory (MRAM) device, or a phase change random access memory (PRAM) device.

A FE memory device is a random access memory similar in construction to a DRAM by using a ferroelectric layer instead of a dielectric layer to achieved non-volatility. FE memory devices typically include a material stack of, from bottom to top, a bottom electrode, a ferroelectric layer, and a top electrode. Thus, and in the present application, the memory element 50 is an electrically conductive metal-containing material stack of a ferroelectric layer, and a top electrode; bottom electrode 54 serves as the bottom electrode for the FE memory device. The top electrode may be composed of a metal or metal nitride. For example, TiN may be used as the material for the top electrode. The ferroelectric layer is composed of one or more ferroelectric materials exhibiting ferroelectricity (i.e., a material that has a spontaneous electric polarization that can be reversed by the application of an external electric field). Examples of ferroelectric materials that can be used as the ferroelectric layer include, but at not limited to, mixed metal oxides such as, $BaTiO_3$, $Pb(Zr_xTi_{1-x})O_3$ ($0.1 \leq x \leq 1$), or crystalline $HfO_2$ with, or without, a doping element selected from Zr, Al, Ca, Ce, Dy, Er, Gd, Ge, La, Sc, Si, Sr, Sn, C, N, and Y.

A ReRAM device is a random access memory that typically includes a material stack of, from bottom to top, a bottom electrode, a metal oxide that can exhibit a change in electron localization, and a top electrode. Thus, and in the present application, the memory element 50 is an electrically conductive metal-containing material stack of a ferroelectric layer, and a top electrode; bottom electrode 54 serves as the bottom electrode for the ReRAM device. The top electrode may be composed of a metal or metal nitride. For example, TiN may be used as the material for the top electrode. The metal oxide may include oxides of nickel, zirconium, hafnium, iron, or copper.

A MRAM device is a random access memory, that includes a magnetic tunnel junction (MTJ) structure formed on bottom electrode 54. The magnetic tunnel junction (MTJ) structure can include a magnetic reference layer, a tunnel barrier, and a magnetic free layer. The magnetic reference layer has a fixed magnetization. The magnetic reference layer may be composed of a metal or metal alloy that includes one or more metals exhibiting high spin polarization. In alternative embodiments, exemplary metals for the formation of the magnetic reference layer include iron, nickel, cobalt, chromium, boron, and manganese. Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier of the MTJ structure is composed of an insulator material and is formed at such a thickness as to provide an appropriate tunneling resistance. Exemplary materials for the tunnel barrier include magnesium oxide, aluminum oxide, and titanium oxide, or materials of higher electrical tunnel conductance, such as semiconductors or low-bandgap insulators.

The magnetic free layer of the MTJ structure is composed of at least one magnetic material with a magnetization that can be changed in orientation relative to the magnetization orientation of the reference layer. Exemplary materials for the free layer of the MTJ structure include alloys and/or multilayers of cobalt, iron, alloys of cobalt-iron, nickel, alloys of nickel-iron, and alloys of cobalt-iron-boron.

A PRAM device is a random access memory that typically includes a material stack of, from bottom to top, a bottom electrode, a phase change memory material that exhibits a change in atomic order (from crystalline to amorphous or vice versa), and a top electrode. Thus, and in the present application, the memory element 50 is an electrically conductive metal-containing material stack of a ferroelectric layer, and a top electrode; bottom electrode 54 serves as the bottom electrode for the PRAM device. The top electrode may be composed of a metal or metal nitride. For example, TiN may be used as the material for the top electrode. The phase change memory material may include a chalcogenide glass such as, for example, $Ge_2Sb_2Te_5$ or $Ge_2Bi_2Te_6$.

Additional ILD material is then formed laterally adjacent to, and atop, the first conductivity type top source/drain structure 50, the second conductivity type top source/drain structure 52, the bottom electrode 54 and the memory element 56 and atop ILD material 37. Collectively the additional ILD material and the ILD material 37 is labeled as element 39 in the drawings. The additional ILD material is typically the same as the ILD material 37. The additional ILD material can be formed using one of the techniques mentioned above for forming ILD material layer 36.

Contact structures 58, 60 are then formed. Contact structures 58 contact a surface of the bottom source/drain structure (20, 24), while contact structures 60 contact a surface of the memory element 56. Contact structures 28 form bitlines of the memory array, while contact structures 60 form select lines of the memory array. The contact structures 58, 60 are formed utilizing techniques well known to those skilled in the art. The contact structures 58, 60 can be composed of a contact metal or a contact metal alloy such as, for example, tungsten (W), cobalt (Co), platinum (Pt), nickel (Ni) or alloys thereof. Each contact structures 60 can be referred to as a bitline, while each contact structure 58 can be referred to as select lines.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A cross-point memory comprising:
an array of bitlines, wordlines, select lines, memory cells and selection elements arranged in a cross-point memory configuration, wherein each selection element is comprised of a n-channel vertical field effect transistor (VFET) and a p-channel VFET with shared source/drain terminals, wherein the n-channel VFET is separated from the p-channel VFET by a dielectric spacer, and wherein the n-channel VFET and the p-channel VFET in two adjacent memory cells have gate structures that share a common wordline.

2. The cross-point memory array of claim 1, wherein each memory cell is vertically integrated on one of the selection elements.

3. The cross-point memory array of claim 1, wherein each memory cell shares a common bitline.

4. The cross-point memory array of claim 1, wherein each memory cell shares a common select line.

5. The cross-point memory array of claim 1, wherein each memory cell includes a bottom electrode, and a memory element.

6. The cross-point memory array of claim 5, wherein the memory element is a component of one of a ferroelectric memory (FE) device, a resistive random access memory (ReRAM) device, a magnetoresistive random access memory (MRAM) device, or a phase change random access memory (PRAM) device.

7. The cross-point memory array of claim 1, wherein the dielectric spacer directly contacts a bottommost surface of one of the memory cells.

8. The cross-point memory array of claim 1, wherein the n-channel VFET comprises a first semiconductor pillar, a first conductivity type bottom source/drain structure located at a first end of the first semiconductor pillar, and a first conductivity type top source/drain structure located at a second end of the first semiconductor pillar that is opposite the first end, and wherein the p-channel VFET comprises a second semiconductor pillar, a second conductivity type bottom source/drain structure located at a first end of the second semiconductor pillar, a second conductivity type top source/drain structure located at a second end of the second semiconductor pillar that is opposite the first end.

9. The cross-point memory array of claim 1, wherein the bitlines, the wordlines, the select lines, the memory cells and the selection elements are embedded in an interlayer dielectric material.

10. The cross-point memory array of claim 1, wherein the memory cells and are vertically stacked above the selection elements, and the bitlines are vertically stacked above memory cells.

11. A method of forming a cross-point memory, the method comprising:
   forming a plurality of semiconductor fins on a surface of a semiconductor substrate, wherein each semiconductor fin is capped with a first hard mask cap and a pair of second hard mask caps;
   forming a first conductivity type bottom source/drain structure in the semiconductor substrate and on a first side of each of the semiconductor fins;
   forming a second conductivity type bottom source/drain structure in the semiconductor substrate that is located on a second side of each of the semiconductor fins, wherein the second side is opposite the first side;
   forming a gate structure laterally adjacent to each semiconductor fin;
   removing each first hard mask cap, an underlying portion of each semiconductor fin and an underlying portion of the semiconductor substrate to provide a gap that separates a first semiconductor pillar of a first conductivity type vertical field effect transistor (VFET) from a second semiconductor pillar of a second conductivity type VFET;
   filling the gap with a dielectric material to provide a dielectric spacer;
   forming gate contact trenches that physically exposes each gate structure of the first and second conductivity type VFETs;
   forming a buried wordline contact structure in a lower portion of each of the gate contact trenches;
   removing the second hard mask caps from atop the first and second semiconductor pillars;
   recessing an upper portion of the gate structures;
   forming a first conductivity type top source/drain structure on an exposed surface of the first semiconductor pillar of the first conductivity type VFETs, and a second conductivity type top source/drain structure from an exposed surface of the second semiconductor pillar of the second conductivity type VFETs;
   forming a memory cell above each pair of first conductivity type VFETs, and second conductivity type VFETs that are separated by the dielectric spacer; and
   forming bitlines contacting the memory cell, and select lines that contact the bottom source/drain structures of the first conductivity type VFETs and second conductivity type VFETs.

12. The method of claim 11, wherein the forming of the first conductivity type bottom source/drain structure comprising:
   forming a first dielectric material liner having an opening that physically exposes the semiconductor substrate that is present on the first side of each of the semiconductor fins;
   forming a trench in the physically exposed portion of semiconductor substrate that is present on the first side of each of the semiconductor fins;
   epitaxially growing a first epitaxial semiconductor material containing a first conductivity dopant in the trench; and
   removing the first dielectric material liner.

13. The method of claim 12, wherein the forming of the second conductivity type bottom source/drain structure comprising:
   forming a second dielectric material liner having an opening that physically exposes the semiconductor substrate that is present on the second side of each of the semiconductor fins;
   forming a trench in the physically exposed portion of semiconductor substrate that is present on the second side of each of the semiconductor fins;
   epitaxially growing a second epitaxial semiconductor material containing a second conductivity dopant in the trench; and
   removing the second dielectric material liner.

14. The method of claim 11, wherein the forming of the memory cell comprises:
   forming a bottom electrode; and
   forming a memory element.

15. The method of claim 14, wherein the memory element comprises a component of one of a ferroelectric memory (FE) device, a resistive random access memory (ReRAM) device, a magnetoresistive random access memory (MRAM) device, or a phase change random access memory (PRAM) device.

16. The method of claim 11, further comprising forming a shallow trench isolation structure in the semiconductor substrate and between each neighboring semiconductor fins.

17. The method of claim 11, wherein the forming of the gate structure comprises:
   forming a bottom spacer laterally adjacent to a lower portion of each semiconductor fin;
   forming a high-k gate dielectric material laterally adjacent to an upper portion of each semiconductor fin and above the bottom spacer; and
   forming a work function metal on the high-k gate dielectric material.

18. The method of claim 11, wherein the forming of the first conductivity type top source/drain structure and the forming of the second conductivity type top source/drain structure comprises:
   forming a top spacer laterally adjacent to an upper portion of each semiconductor pillar and above the recessed gate structure; and
   epitaxially growing, in any order, the first conductivity type top source/drain structure and the second conductivity type top source/drain structure.

19. The method of claim 11, wherein the first hard mask cap has a width that is greater than a width of each of second hard mask caps, and wherein one of the second hard mask caps of the pair of second hard mask caps is located on a first side of the first hard mask cap and a second of the second hard mask caps of the pair of second hard mask caps is located on a second side of the first hard mask cap.

20. A method of operating a cross-point memory array, the method comprising:
   forming an array of bitlines, wordlines, select lines, memory cells and selection elements arranged in a cross-point memory configuration, wherein each selection element is comprised of a n-channel vertical field effect transistor (VFET) and a p-channel VFET with shared source/drain terminals, wherein the n-channel VFET is separated from the p-channel VFET by a dielectric spacer, and wherein the n-channel VFET and the p-channel VFET in two adjacent memory cells have gate structures that share a common wordline;

applying a first voltage via one of the wordlines to the gate structure of the p-channel VFET connected to the memory cell;

applying a second voltage via an adjacent wordline to the gate structure of the n-channel VFET connected to the memory cell, wherein the second voltage is greater than the first voltage; and applying a third voltage to all remaining wordlines, wherein the third voltage is a voltage that is between the first and second voltages, and wherein the second voltage is higher than a threshold voltage of the n-channel VFET and the first voltage is lower than a threshold voltage of the p-channel VFET.

* * * * *